United States Patent
Ali et al.

(10) Patent No.: US 11,159,169 B2
(45) Date of Patent: Oct. 26, 2021

(54) BACKGROUND CALIBRATION OF NON-LINEARITY OF SAMPLERS AND AMPLIFIERS IN ADCS

(71) Applicant: Analog Devices, Inc., Norwood, MA (US)

(72) Inventors: Ahmed Mohamed Abdelatty Ali, Oak Ridge, NC (US); Paridhi Gulati, Sunnyvale, CA (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/877,118

(22) Filed: May 18, 2020

(65) Prior Publication Data
US 2020/0280320 A1   Sep. 3, 2020

Related U.S. Application Data

(63) Continuation of application No. 16/220,870, filed on Dec. 14, 2018, now Pat. No. 10,659,069.

(60) Provisional application No. 62/625,636, filed on Feb. 2, 2018.

(51) Int. Cl.
| | |
|---|---|
| *H03M 1/20* | (2006.01) |
| *H03M 1/06* | (2006.01) |
| *H03M 3/00* | (2006.01) |
| *H03M 13/00* | (2006.01) |

(52) U.S. Cl.
CPC ......... *H03M 1/0641* (2013.01); *H03M 3/348* (2013.01); *H03M 3/358* (2013.01); *H03M 13/6343* (2013.01)

(58) Field of Classification Search
CPC .... H03M 1/12; H03M 1/0641; H03M 1/0639; H03M 1/201; H03M 3/328; H03M 3/332; H03M 3/43; H03M 3/448; H03M 3/454; H03M 7/3008; H03M 7/3028; H03M 7/3035; H03M 7/304; H03M 1/00; H03M 1/0614; H03M 1/0646; H03M 1/144; H03M 1/20; H03M 1/203; H03M 1/207; H03M 1/66; H03M 3/364; H03M 3/452; H03M 3/458
USPC .......................................... 341/131, 118, 120
See application file for complete search history.

(56) References Cited

U.S. PATENT DOCUMENTS

| | | | | |
|---|---|---|---|---|
| 5,187,841 | A * | 2/1993 | Takemura | A44B 19/262 24/429 |
| 5,493,298 | A * | 2/1996 | Bartz | H03M 1/0641 341/118 |
| 6,016,113 | A * | 1/2000 | Binder | H03M 1/201 341/120 |
| 6,950,048 | B1 * | 9/2005 | Slavin | H03M 1/0639 341/131 |

(Continued)

*Primary Examiner* — Linh V Nguyen
(74) *Attorney, Agent, or Firm* — Patent Capital Group

(57) ABSTRACT

Analog circuits are often non-linear, and the non-linearities can hurt performance. Designers would trade off power consumption to achieve better linearity. An efficient and effective calibration technique can address the non-linearities and reduce the overall power consumption. A dither signal injected to the analog circuit can be used to expose the non-linear behavior in the digital domain. To detect the non-linearities, a counting approach is applied to isolate non-linearities independent of the input distribution. The approach is superior to and different from other approaches in many ways.

20 Claims, 18 Drawing Sheets

(56) References Cited

U.S. PATENT DOCUMENTS

| | | | |
|---|---|---|---|
| 7,015,851 B1* | 3/2006 | Bruhns | H03M 1/0641 |
| | | | 341/131 |
| 7,538,701 B2* | 5/2009 | Teeka Srinivasa Shetty | ............... |
| | | | H03M 1/0641 |
| | | | 341/118 |
| 2006/0114144 A1* | 6/2006 | Lyden | H03M 1/0641 |
| | | | 341/161 |
| 2013/0207820 A1* | 8/2013 | Maurino | H03M 3/30 |
| | | | 341/131 |
| 2016/0373128 A1* | 12/2016 | Wang | H03M 1/46 |
| 2017/0041013 A1* | 2/2017 | Nagarajan | H03M 1/0641 |

* cited by examiner

BACKGROUND CALIBRATION OF NON-LINEARITY OF SAMPLERS AND AMPLIFIERS IN ADCS

PRIORITY DATA

This patent application is a Continuation of U.S. patent application Ser. No. 16/220,870 (hereinafter as the '870 application), titled "BACKGROUND CALIBRATION OF NON-LINEARITY OF SAMPLERS AND AMPLIFIERS IN ADCS", filed on Dec. 14, 2018, which is hereby incorporated in its entirety. The '870 application claims priority to and receives benefit of U.S. Provisional Patent Application, Ser. No. 62/625,636, titled "BACKGROUND CALIBRATION OF NON-LINEARITY OF SAMPLERS AND AMPLIFIERS IN ADCS", filed on Feb. 2, 2018, which is hereby incorporated in its entirety.

TECHNICAL FIELD OF THE DISCLOSURE

The present disclosure relates to the field of integrated circuits, in particular to background calibration of analog-to-digital converters (ADCs).

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing circuitry in ADC is a non-trivial task because each application may have different needs in performance, power, cost, and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DETAILED DESCRIPTION

Overview

Figure 1:
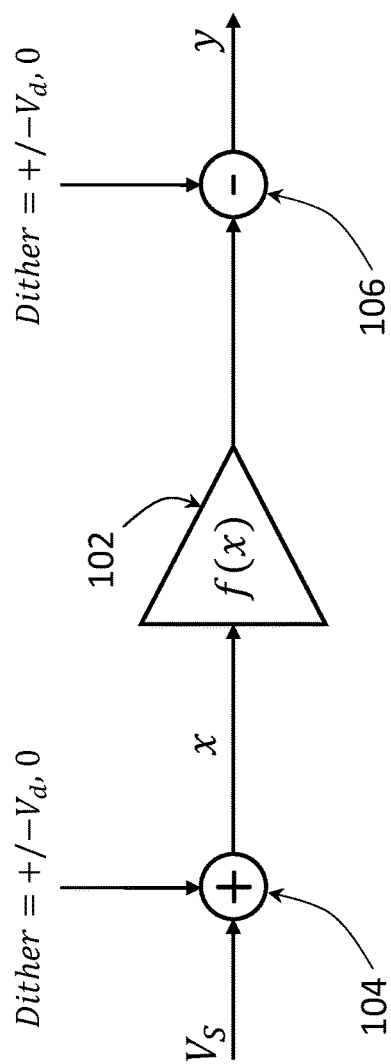
FIG. 1 illustrates injection and removal of dither for a non-linear system, according to some embodiments of the disclosure.

Analog circuits are often non-linear or non-ideal, and the non-linearities or non-idealities can hurt performance. Designers would trade off power consumption to achieve better linearity or have a more ideal circuit. An efficient and effective calibration technique can address the non-linearities or non-idealities and reduce the overall power consumption and achieve the same or better performance. A dither signal injected to the analog circuit can be used to expose the non-linear or non-ideal behavior in the digital domain. To detect the non-linearities or non-idealities, a counting (or histogram-based) approach is applied to isolate non-linearities or non-idealities independent of the input distribution. The approach is superior to and different from other approaches in many ways.

Challenges to Detecting Non-Linearities and Non-Idealities

Performance is greatly affected by the non-linearities (or more broadly, non-idealities) present in the analog circuits making up an ADC. Analog circuits with non-linearities or non-idealities can include buffers, samplers, and multiplying digital-to-analog converter (MDAC) amplifiers. Digital correction of non-linear or non-ideal behavior the analog circuits in ADCs, sometimes referred to as "digitally assisted analog", is an important area of research. If a technique is successful, such techniques would enable substantial power reduction and performance improvement. A technique is successful if the technique can efficiently and effectively extract and correct for the non-linearities of a circuit, or more generally, non-ideal components of the circuit. The calibration technique is preferably more efficient than implementing a more power hungry but more linear or ideal circuit.

While the description herein refers often to non-linearities, the schemes for dealing with the non-linearities can be extended to address non-idealities of a circuit.

Calibration for non-linearities is especially critical in pipelined ADCs whose performance and power consumption are dominated by the MDAC amplifiers. Relaxing the linearity requirements of the MDAC amplifiers, while correcting for the undesirable behavior digitally, can lower the power consumption substantially. The same calibration technique can be used to calibrate other analog circuits in an ADC, such as an input buffer, or a sampler.

Correcting the non-linearity and distortion of non-linear analog circuits would achieve better spurious free dynamic range (SFDR) and intermodulation distortion (IMD) performance at higher input frequencies, and reduce power consumption. Calibration is thus one of the most differentiating and important means for improving an ADC.

Providing an effective and efficient calibration scheme is not so trivial. Black-box digital signal processing approaches that attempt to blindly extract and estimate the non-linear behavior of a circuit or system in the digital domain are not unheard of. However, those techniques suffer from limited effectiveness under varying conditions, and very high power consumption due to the complicated signal processing involved.

In one approach, a correlation-based technique is used where multiple uncorrelated dither signals are injected at a point before the non-linear circuit. If the circuit is linear, those dither signals stay uncorrelated after digitization. In the presence of non-linearity, the dither signals become correlated. The resulting cross-correlation between the amplitude of the signal and the amplitude dither signal is a measure of the non-linearity. Multipliers are usually used for performing cross-correlation. In some cases, to estimate the third order non-linearity, three dither signals are needed. This technique suffers from extremely long convergence time, and sensitivity to non-idealities in the backend. Also, the need for multiple dither signals leads compromises the dynamic range and/or power consumption.

In another correlation-based approach, a technique applies piece-wise linear approximation of the gain. These techniques suffer from long convergence times as well. In addition, effectively dividing the range into segments while preserving the dither's ability to detect the correct gain, leads to approximations that compromise the technique's accuracy.

In yet another approach, a technique relies on the statistics of the digitized signal to estimate the circuit's non-linearity. By randomly changing a Flash ADC's thresholds, this technique creates two different transfer characteristics for the same input value: one near the origin and the other near the peak. If the circuits were linear, the difference between the outputs at any amplitude would be fixed. However, in the presence of non-linearity, the difference between the two outputs would be different. This difference is a measure of the non-linearity. By creating an "error signal" that is proportional to this difference, an adaptation framework can be created to minimize the error using the least means square (LMS) algorithm. While this technique has relatively good convergence time, it is sensitive to the input signal's distribution and requires changes in the analog circuits (e.g., the Flash ADC) to create two different transfer characteristics. Although promising, it is limited in its applicability.

Improved Calibration Techniques

Addressing some of the shortcomings of other calibration techniques, an improved calibration technique uses a dither signal to expose the non-linear or non-ideal behavior of an analog circuit in the digital domain. The dither signal is injected before the circuit to be calibrated, which can be a sampler, a track and hold circuit, a buffer or an MDAC amplifier. Other analog circuitry can also benefit from the improved calibration techniques. The dither signal is used in a unique way, based on the insight that superposition does not apply in non-linear or non-ideal systems. In other words, if the output of the circuit is $y_1$ to a certain input $x_1$, and if a dither equal to $V_d$ is added to or subtracted from the input, and the same value from the output is subtracted or added to obtain $y_2$, then $y_2$ will be equal to $y_1$ in a linear system and $y_2$ will be different from $y_1$ in a non-linear or non-ideal system. That difference between $y_2$ and $y_1$ can be used to estimate the non-linearities, such as second and third order non-linearities, or more generally, non-ideal components of the circuit.

FIG. 1 illustrates injection and removal of dither for a non-linear system, according to some embodiments of the disclosure. The non-linear system 102, such as an analog circuit under calibration, is represented by function $f(x)$. The input to the function $f(x)$ is represented by x, and the output of the function $f(x)$ is represented by y. In this example shown, a dither signal having possible values $+V_d$, $-V_d$, and 0, can be injected to the input by summer 104. The same dither signal can be removed from the output by subtractor 106. When there are one or more non-linearities, superimposition does not apply, and the injection and subsequent removal of the dither would result in a difference between the expected (or ideal/linear) output ($y_1$) and the actual output ($y_2$). Accordingly, it is possible to extract information about $f(x)$, i.e., the non-linearities, based on the output y. More specifically, it is possible to extract information about $f(x)$, i.e., the non-linearities, based on the difference or error between the expected output $y_1$ and the actual output $y_2$.

Figure 2:
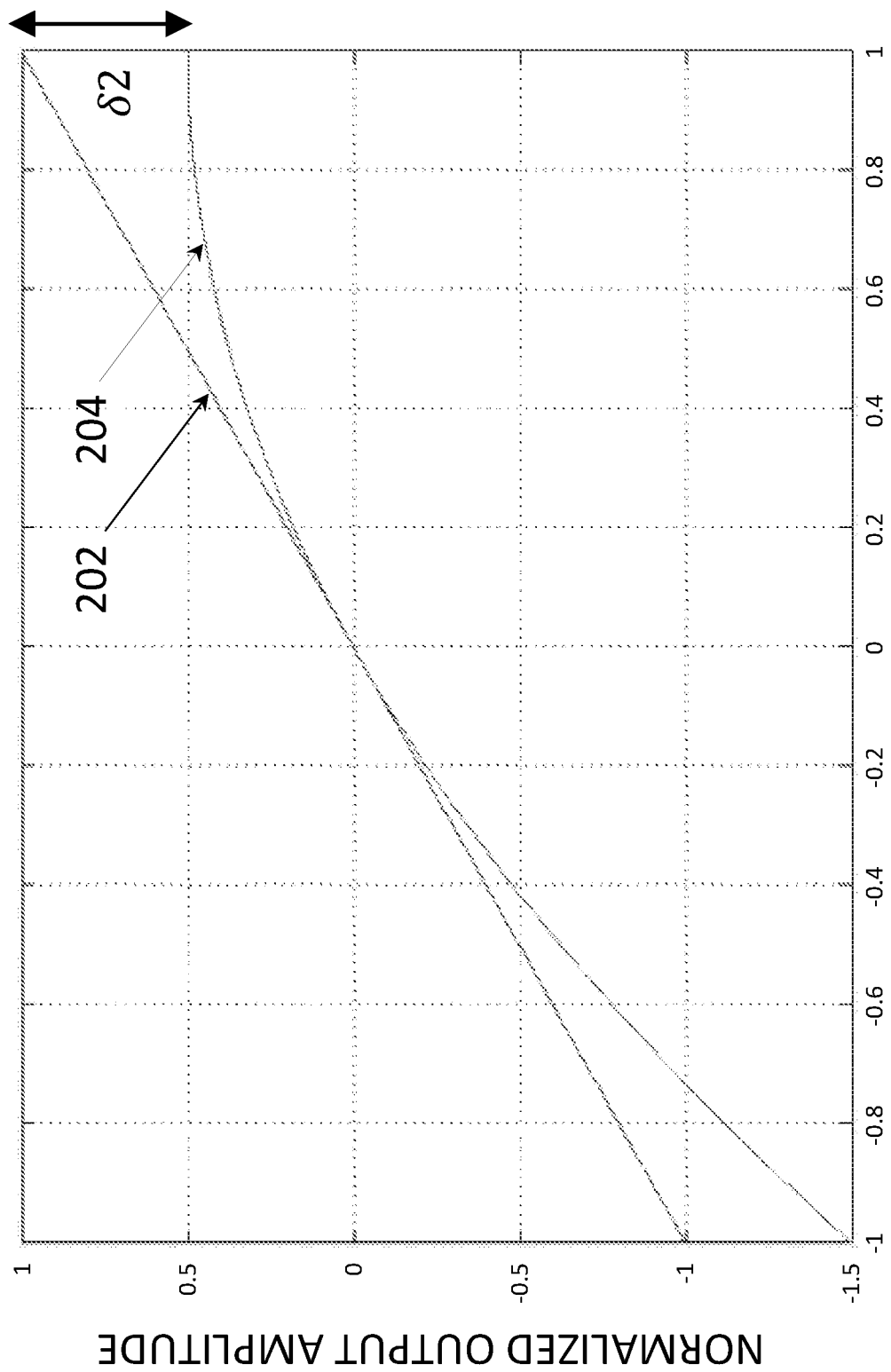
FIG. 2 shows a transfer characteristic of a second order non-linearity, according to some embodiments of the disclosure.

FIG. 2 shows a transfer characteristic of a second order non-linearity, according to some embodiments of the disclosure. The X-axis represents the input, and the Y-axis represents the output. Curve 202 illustrates the input to output relationship of an exemplary linear system. Curve 204 illustrates the input to output relationship of an exemplary system having a second order non-linearity. δ2 represents the error, or difference between the expected output and the actual output, where the difference is a result of the second order non-linearity. Note that the error is evenly symmetric around the x=0 axis.

Figure 3:
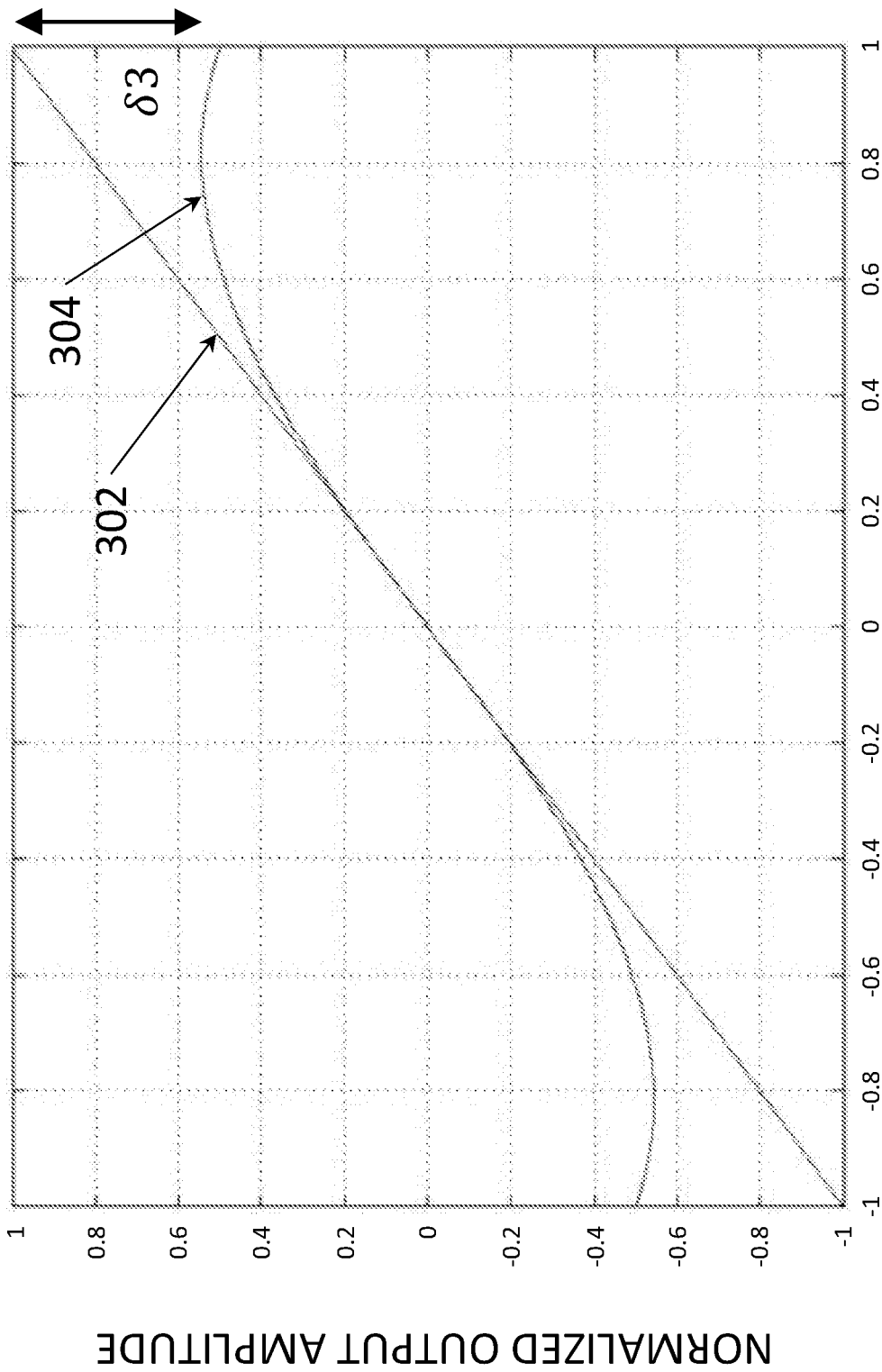
FIG. 3 shows a transfer characteristic of a third order non-linearity, according to some embodiments of the disclosure.

FIG. 3 shows a transfer characteristic of a third order non-linearity, according to some embodiments of the disclosure. The X-axis represents the input, and the Y-axis represents the output. Curve 302 illustrates the input to output relationship of an exemplary linear system. Curve 304 illustrates the input to output relationship of an exemplary system having a third order non-linearity. δ3 represents the error or difference between the expected output and the actual output, where the difference is a result of the third order non-linearity. Note that the error is oddly symmetric around the x=0 axis.

Suppose the input to output relationship for $x_1$ and $y_1$ is the following:

$$y_1 = f(x_1) \quad (1)$$

If a dither $V_d$ is injected and removed, then the input to output relationship for $x_1$ and $y_2$ is the following (where $\widehat{V_d}$ is the estimate of $f(V_d)$, which is a value of the dither after it has been processed by the function $f(x)$):

$$y_2 = f(x_1 + V_d) - \widehat{V_d}, \quad (2)$$

If $f(x)$ is linear, then $$y_1 = f(x_1) = ax_1 \quad (3)$$

and $$y_2 = ax_1 + aV_d - \widehat{V_d} = ax_1 + aV_d - aV_d = ax_1 \quad (4)$$

Therefore, $$y_1 = y_2 \quad (5)$$

If $f(x)$ is non-linear, then:

$$y_1 \neq y_2 \quad (6)$$

For example, if $f(x)$ is a $3^{rd}$ order non-linear function:

$$y_1 = f(x_1) = ax_1 + \alpha x_1^3 \quad (7)$$

and $$y_2 = f(x_1 + V_d) - \widehat{V_d} = a(x_1 + V_d) + \alpha(x_1 + V_d)^3 - V_d)^3 - \widehat{V_d} \, y_1 \quad (8)$$

The only way for $y_1$ and $y_2$ to be equal for multiple values of $x_1$ and $V_d$ is when a is equal to zero (i.e., when the third order function is gone). Moreover, the above equation means that the relationship between the outputs for different dither values, i.e., different values for $V_d$ can be used to estimate the nature and magnitude of the non-linearity. In some cases, an output $y_1$ can refer to an output as a result of adding and removing dither having a first dither value, and the output $y_2$ can refer to an output as a result of adding and removing dither having a second dither value (different from the first dither value).

Figure 4:
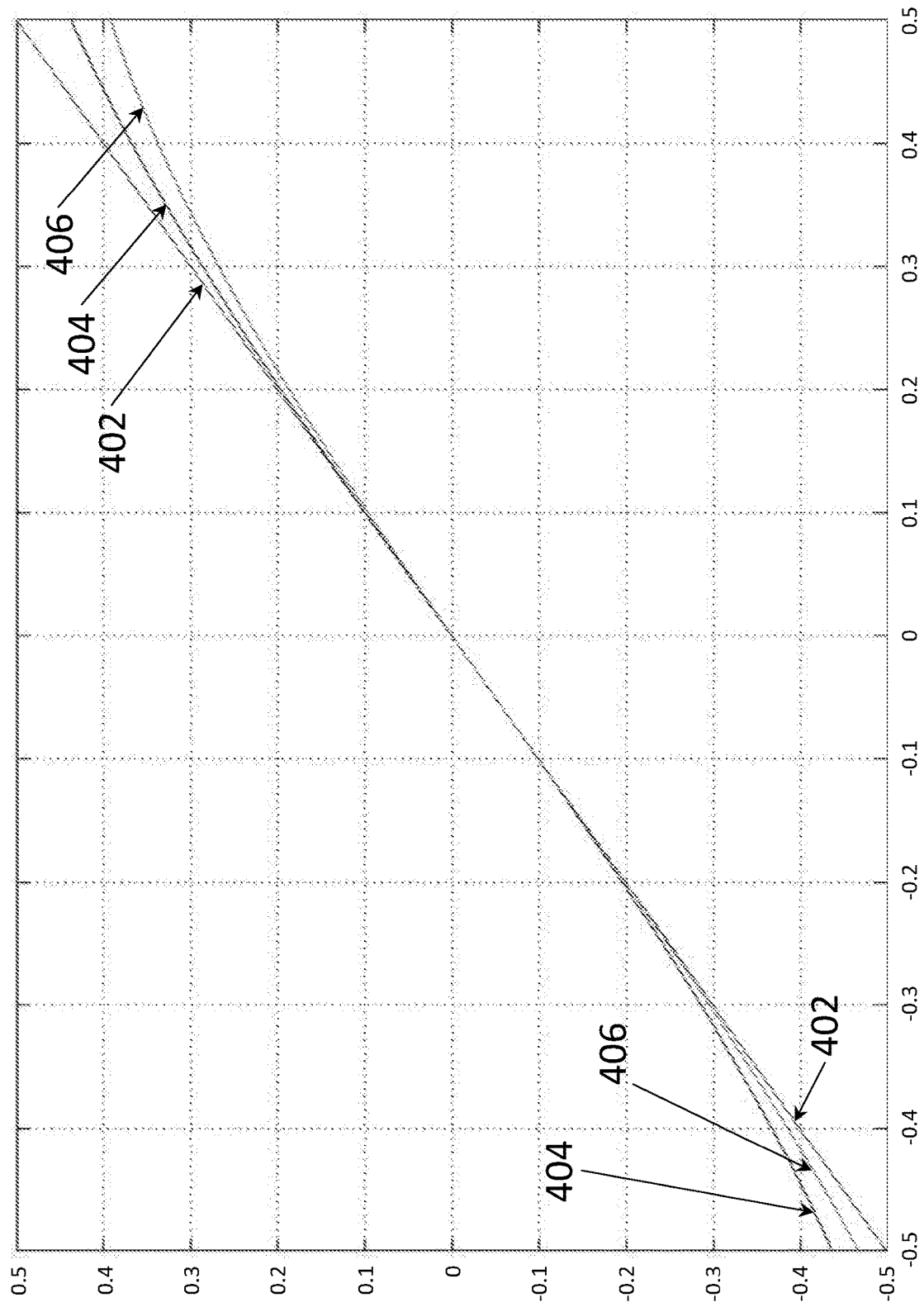
FIG. 4 illustrates input to output relationships of a linear system and a system in the presence of a third order non-linearity, according to some embodiments of the disclosure.
Figure 5:
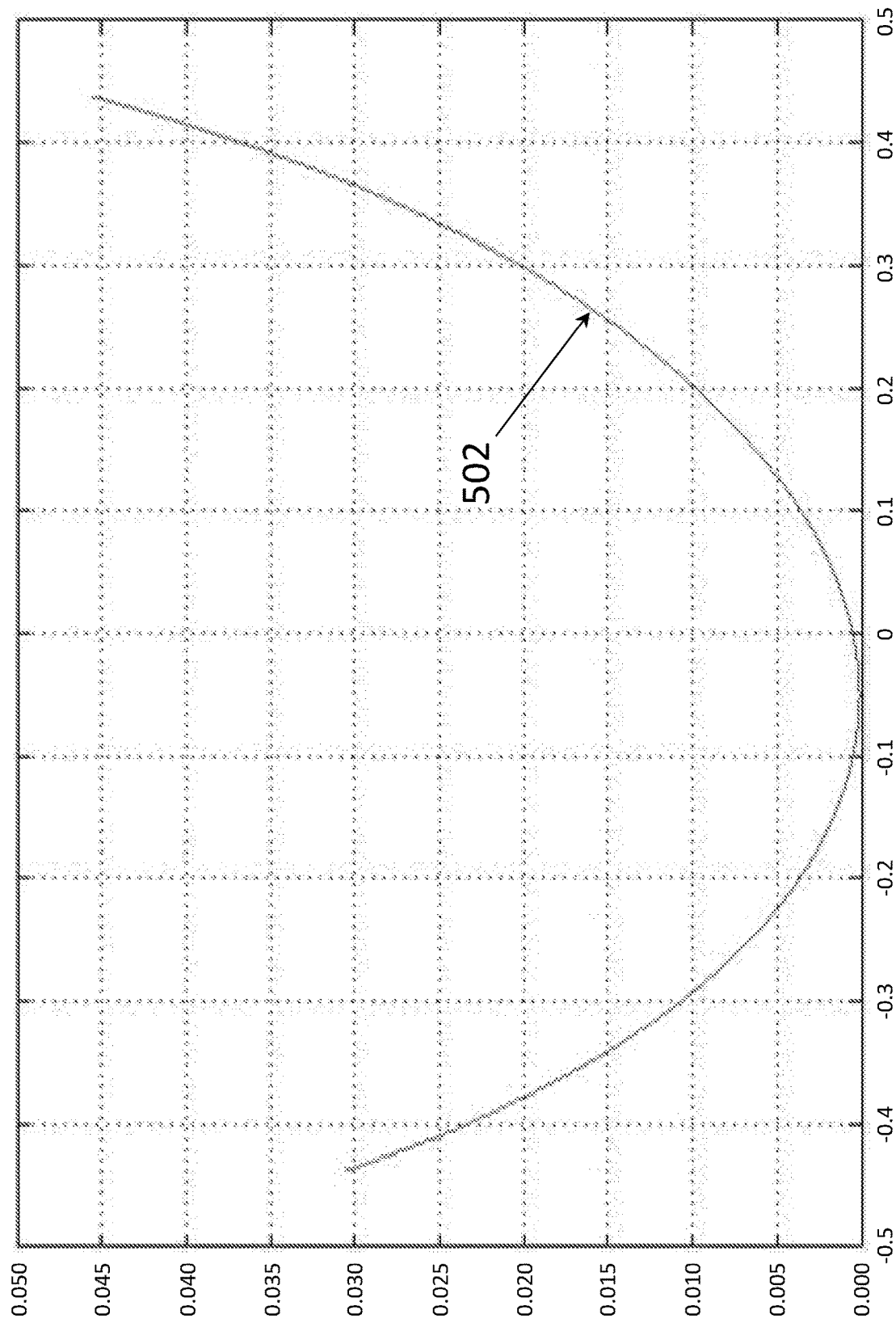
FIG. 5 shows a difference between the actual output and the expected output in the presence of the third order non-linearity, according to some embodiments of the disclosure.

FIG. 4 illustrates input to output relationships of a linear system and a system in the presence of a third order non-linearity, according to some embodiments of the disclosure. The X-axis represents the input to the system. The Y-axis represents the output of the system. Note that the error is oddly symmetric around the x=0 axis. Curve 402 shows the input to output relationship of a linear system. Curve 404 shows the input to output relationship of a non-linear system, or the transfer characteristic of output $y_1$, without the use of dither. Curve 406 shows the input to output relationship of a non-linear system, or the transfer characteristic of output $y_2$, with the use of dither and the dither injected and removed to expose non-linearities. FIG. 5 shows a difference between the output $y_2$ and the output $y_1$ in the presence of the third order non-linearity, according to some embodiments of the disclosure. Curve 502 shows a difference or error, i.e., $y_2 - y_1$, which can be used as an estimate for the non-linearity.

Figure 6:
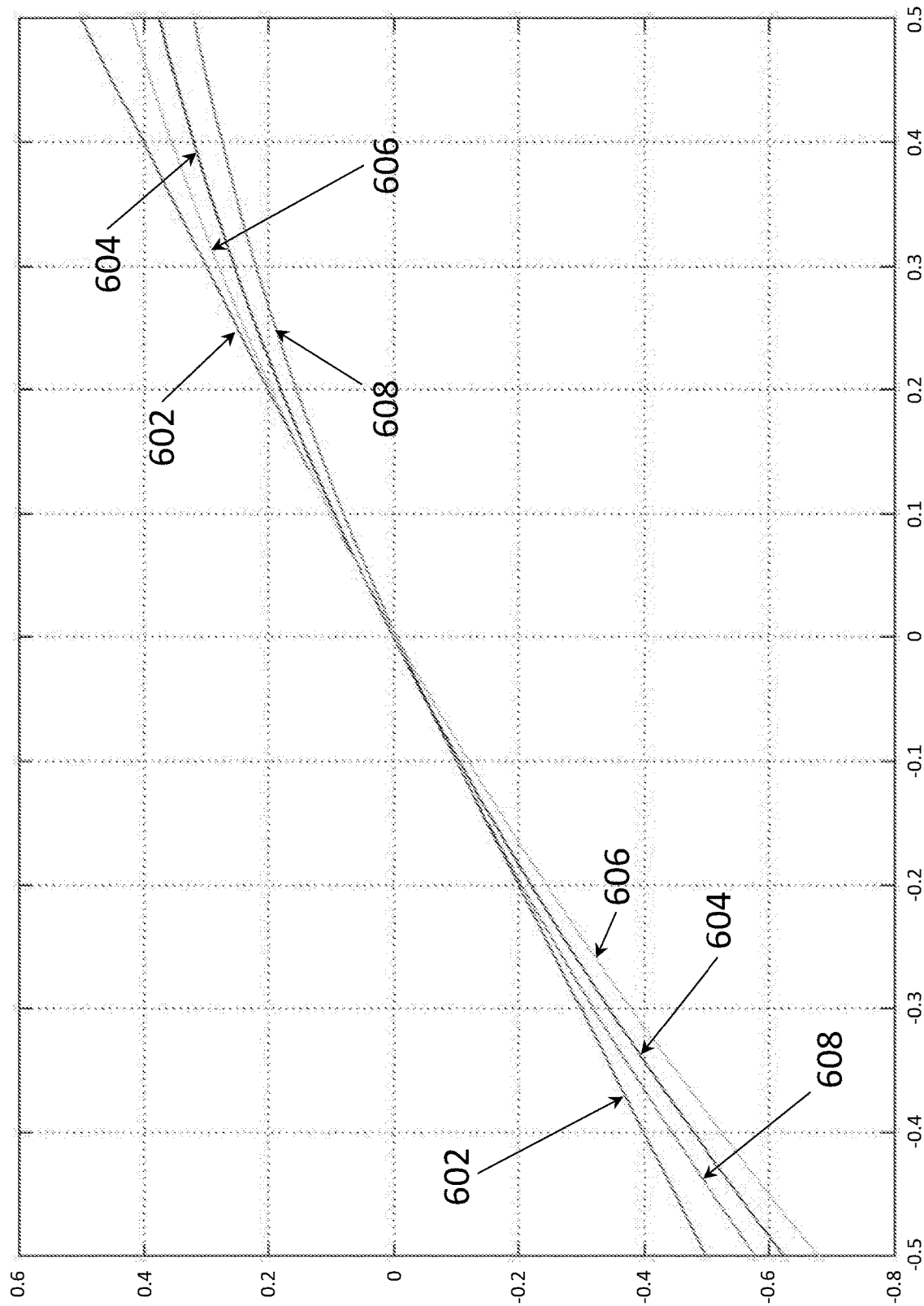
FIG. 6 illustrates input to output relationships of a linear system and a system in the presence of a second order non-linearity, according to some embodiments of the disclosure.

FIG. 6 illustrates input to output relationships of a linear system and a system in the presence of a second order non-linearity, according to some embodiments of the disclosure. The X-axis represents the input to the system. The Y-axis represents the output of the system. Note that the error is evenly symmetric around the x=0 axis. Curve 602 shows the input to output relationship of a linear system. Curve 604 shows the input to output relationship of a non-linear system, or the transfer characteristic of output $y_1$, without the use of dither. Curve 606 shows the input to output relationship of a non-linear system, or the transfer characteristic of output $y_2$, with the use of negative dither and the dither injected and removed to expose non-linearities. Curve 608 shows the input to output relationship of a non-linear system, or the transfer characteristic of output $y_3$, with the use of positive dither and the dither injected and removed to expose non-linearities. It can be seen that different values of the dither causes the system to exhibit different transfer characteristics, when the system is non-linear (or more broadly, not ideal).

In practice, there is no direct access to the input (x) of the system being calibrated. There is however access to the output (y) of the system being calibrated, e.g., in the digital domain. In other words, it is not possible to generate plots of the transfer characteristics seen in FIG. 6. To deduce information about the non-linearities (i.e., the transfer characteristics), it is possible to use counts or histograms of the output values (e.g., differential non-linearity or DNL) and/or cumulative sums or cumulative distribution functions (CDF) (e.g., integral non-linearity or INL) information, computed for different values of the dither, to deduce the input behavior and transfer characteristic for a certain input/output value. This counting approach to estimate the input behavior and transfer characteristic differences between different dither values is a deterministic method that can achieve fast convergence in the presence or absence of an input signal.

While there can be similarities of this scheme with other techniques, this calibration approach utilizes additive dither signals to expose the non-linearity, and do not require analog changes to the circuitry of a sub-ADC (Flash ADC) within an ADC. More importantly, this calibration approach is dither-dependent, and not input-dependent. The calibration approach relies on counting instead of using multipliers to compute cross-correlations. The use of an additive dither also means that the calibration approach can be applied on any non-linear system or circuit where additive dither is injected (i.e., not just MDACs of an ADC). The calibration approach is not trivial, since the setup creates some challenges relating to how to accurately detect or deduce the non-linearity from the dither and output values. These challenges are addressed in the passages which follow.

Exposing and Extracting the Non-Linearity Through the Additive Dither

The dither (e.g., a random value) being injected and removed can be uniformly distributed between two, three, or more values. For example, a suitable dither can be randomly distributed between three values: $V_d$, $-V_d$, and 0. Another suitable dither can be randomly distributed between two values: $V_d$ and $-V_d$. The value of the dither is known. The dither is added/injected to the system when it is injected, and subsequently subtracted/removed from the system when it is removed.

The output of the system can be checked at certain values, referred herein as inspection points (e.g., $V_{insp}$). The system, which is an analog circuit under calibration, can generate an analog output that can be digitized by an ADC. Accordingly, a digital signal y (which is a digital output of the ADC) can be used to represent the (analog) output of the system. Herein, the digital signal y can be used interchangeably with the (analog) output of the system.

To check the output of the system, the inspection points are used to define ranges in the output where counts can be accumulated (or cumulative histograms can be determined or computed). The exact magnitudes of the inspection points are not critical, but the inspection points are determined or chosen to expose the harmonic (i.e., non-linearity) to be detected, more specifically, a shape/pattern associated with the harmonic to be detected. For example, since second order distortion (second harmonic HD2) causes evenly symmetrical errors around the center point, while third order distortion (third harmonic HD3) causes oddly symmetrical errors around the center point, the inspection points for the detection and correction of HD2 and HD3 can be at $+/-V_{insp}$, where $V_{insp}$ is an arbitrary value. It can be, for example, at the magnitude of the dither signal where $V_{insp}=V_d$ or at half of the dither signal where $V_{insp}=V_d/2$. For a higher order distortion (such as fifth or seventh), the inspection point is preferably at a relatively large amplitude to expose the severe compression caused by the higher order distortion near the ends of the signal range. In some cases, the inspection points can also be fixed or changing (randomly or deterministically) to accommodate different input conditions. A large inspection point may be more effective in detecting the non-linearity, but may have less hits depending on the input conditions. Multiple inspection points can also be used to improve the convergence time and/or improve the detection effectiveness.

One technical advantage of the calibration technique is that the technique is independent of the input distribution. To achieve this advantage, the error signal generated by the technique is in the form of differences between distributions defined at the same output value (i.e., a chosen inspection point). By defining the error signal in a way to not rely on the input distribution or the exact shape of the input distribution, independence from the input distribution can be achieved. Moreover, in some cases, a multi-level dither can be used to extract the non-linearity in the absence of an input signal.

The error signal generated by the technique can represent the difference in the outputs for the various dither cases at a given inspection point, since the outputs for the various dither cases (i.e., with the dither injected and moved) at a given inspection point expose the non-linearities in the system. If the system is linear (or more broadly, ideal), then outputs or counts/histograms for various dither cases at the given inspection point are expected to be the same. However, if the system is non-linear (or more broadly, not ideal), then the outputs or counts/histograms on the outputs for various dither cases at the given inspection point are not the same. Errors can be defined based on the counts/histograms to expose a particular non-linearity or non-ideality. The technical task of the calibration technique is to minimize that error or error signal, and linearize the system.

Figure 7:
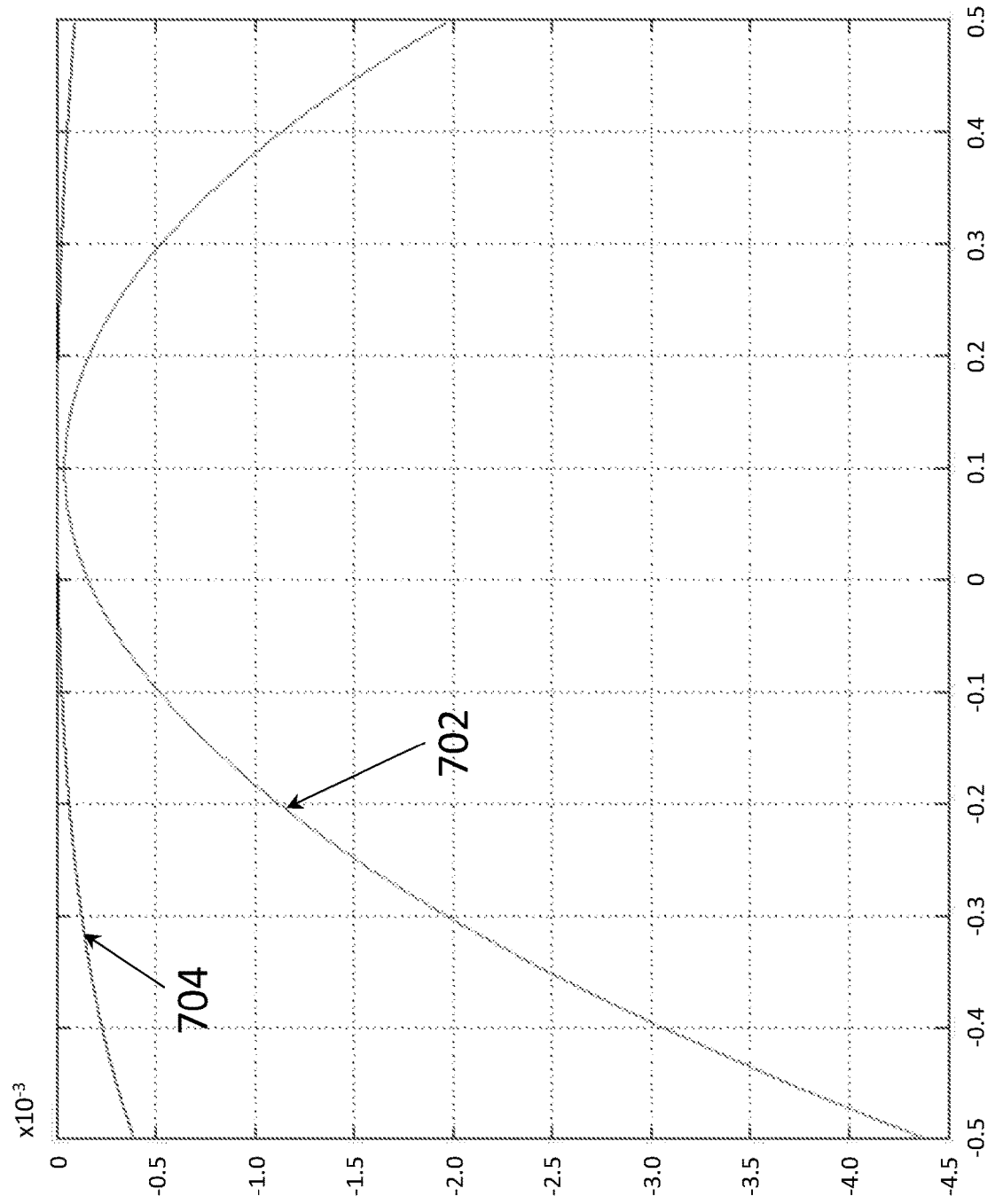
FIG. 7 shows the difference in the outputs (e.g., $y_2-y_1$) before and after calibration of a third order non-linearity, according to some embodiments of the disclosure.

FIG. 7 shows the difference in the outputs (e.g., $y_2-y_1$) before and after calibration of a third order non-linearity, according to some embodiments of the disclosure. Curve 702 is the difference in the outputs (e.g., $y_2-y_1$) before calibration. Curve 704 is the difference in the outputs (e.g., $y_2-y_1$) after calibration. Since the calibration technique does not have access to the input with the desired accuracy, the calibration technique utilizes histograms or cumulative distribution functions defined by inspection points to estimate the input and transfer characteristic for different dither values and extract the non-linearities. Phrased differently, the calibration technique does not have direct access to the error signal or how the dither actually affects the transfer characteristic. However, the calibration technique can utilize histograms or cumulative distribution functions defined by inspection points, as estimates of the transfer characteristics, and compare the estimates between different dither values, to estimate what the error is for a given output value (i.e., inspection point). Based on the histograms or cumulative distribution functions defined by inspection points, comparison of the estimates for different dither values, and appropriate error equations, it is possible to extract information about the non-linearities (being exposed as an error between different dither values) and correct for the non-linearities (drive the errors to zero). Specifically, the calibration technique can progressively correct the non-ideal components of the circuit, use a corrected output to update future estimates of the non-ideal components of the circuit, and drive the errors towards zero in a closed-loop manner. More specifically, the differences in distributions/estimates for different dither values at various inspection points can form partial errors that can be used to form the error estimate (or error signal) of a given non-linearity (or more generally, a component of the circuit being calibrated). After calibration, distortions on the output can be significantly reduced, as illustrated in FIG. 7.

Exposing and Extracting Second Order Distortion

For second order distortion, two inspection points such as $+/-V_{insp}$ (e.g., positive inspection point $V_{insp}$ and negative inspection point $-V_{insp}$) can be chosen. The inspection points can be chosen to be at a convenient or suitable amplitude, e.g., using two dither amplitudes at $+/-V_d$. The inspection points can define ranges of the output. A range of the output defined by an inspection point means that the inspection point can serve as an end point of an open interval or closed interval of the output. Estimates based on counts/histograms can be computed based on the ranges defined by the inspection points. Estimates based on a given range defined by an inspection point, as used herein, means counting samples falling within the given range and deriving a count or a cumulative histogram. Estimates are computed separately for different values of the dither. The count is an estimate of the transfer characteristic, thus non-idealities, at a given inspection point for a specific value of the dither. On the digital backend, the number of points (e.g., histograms and cumulative probability distributions) of the output having amplitudes less than or equal to $+/-V_{insp}$, or more than or equal to $+/-V_{insp}$ can be calculated for: (1) the case when the dither is equal to positive dither $V_d$ (e.g., counting the number of points of the output after subtracting the ideal/estimated dither value), (2) the case when the dither is equal to negative dither $-V_d$ (e.g., counting the number of points of the output after adding the ideal/estimated dither value), and/or (3) the case when the dither is equal to zero. By comparing the counts/cumulative histograms (i.e., the estimates) between different values of the dither, it is possible to estimate/extract the error of the circuit, since the counts/cumulative histograms for different values of the dither are expected to be the same if the circuit is linear (or more broadly, ideal).

The difference of the counts/cumulative histograms for the two cases (i.e., the two dither values) is expected to be fixed and independent of the amplitude (i.e., independent of the input distribution). Therefore, the difference (which would be present in the presence of second order non-linearity) can qualify as a part of an "error signal" ε.

Specifically, parts of the error signal ε (referred herein as partial errors) are given by (partial) error at the positive inspection point $V_{insp}$ and (partial) error at the negative inspection point $-V_{insp}$:

$$\varepsilon_{HD2}(V_{insp}) = \text{Cumsum}_{V_{insp}}(V_{out} - \text{Dither})|_{Dither=V_d} - \text{Cumsum}_{V_{insp}}(V_{out} - \text{Dither})|_{Dither=-V_d} \quad (9a)$$

and $$\varepsilon_{HD2}(-V_{insp}) = \text{Cumsum}_{-V_{insp}}(V_{out} - \text{Dither})|_{Dither=-V_d} - \text{Cumsum}_{-V_{insp}}(V_{out} - \text{Dither})|_{Dither=V_d} \quad (10a)$$

$\text{Cumsum}_x(y)$ is the cumulative histogram (i.e., count) of digital codes of digital signal y less than or equal to x.

The errors are computed by examining the output, i.e., the output with the dither removed, for a block of data on the output and associated dither values. For instance, if the dither is negative, the errors are computed by examining $V_{out}+V_d$ or if the dither is positive, the errors are computed by examining $V_{out}-V_d$. $\varepsilon_{HD2}(V_{insp})$, the error at the positive inspection point $V_{insp}$, is the difference in counts of the output less than or equal to the positive inspection point $V_{insp}$ between the two cases where the dither is positive and when the dither is negative. $\varepsilon_{HD2}(-V_{insp})$, the error at the negative inspection point $-V_{insp}$, is the difference in counts of the output less than or equal to the negative inspection point $-V_{insp}$ between the two cases where the dither is negative and when the dither is positive. Alternatively and in general, histograms can be used in place of cumulative distributions. The error signal can be based on partial errors computed at multiple inspection points to speed up the convergence.

Instead of comparing the cases when the dither is positive and when the dither is negative, $\varepsilon_{HD2}(V_{insp})$, the error at the positive inspection point $V_{insp}$, can be defined as the difference in counts of the output less than or equal to the positive inspection point between the two cases where the dither is positive and when the dither is zero. $\varepsilon_{HD2}(-V_{insp})$, the error at the negative inspection point $-V_{insp}$, can be defined as the difference in counts of the output less than or equal to the negative inspection point $-V_{insp}$ between the two cases where the dither is negative and when the dither is zero:

$$\varepsilon_{HD2}(V_{insp}) = \text{Cumsum}_{V_{insp}}(V_{out} - \text{Dither})|_{Dither=V_d} - \text{Cumsum}_{V_{insp}}(V_{out})|_{Dither=0} \quad (9b)$$

and $$\varepsilon_{HD2}(-V_{insp}) = \text{Cumsum}_{-V_{insp}}(V_{out} - \text{Dither})|_{Dither=-V_d} - \text{Cumsum}_{-V_{insp}}(V_{out})|_{Dither=0} \quad (10b)$$

When the dither is zero (Dither=0), then the sample being observed is $V_{out}-\text{Dither}=V_{out}$.

Figure 8:
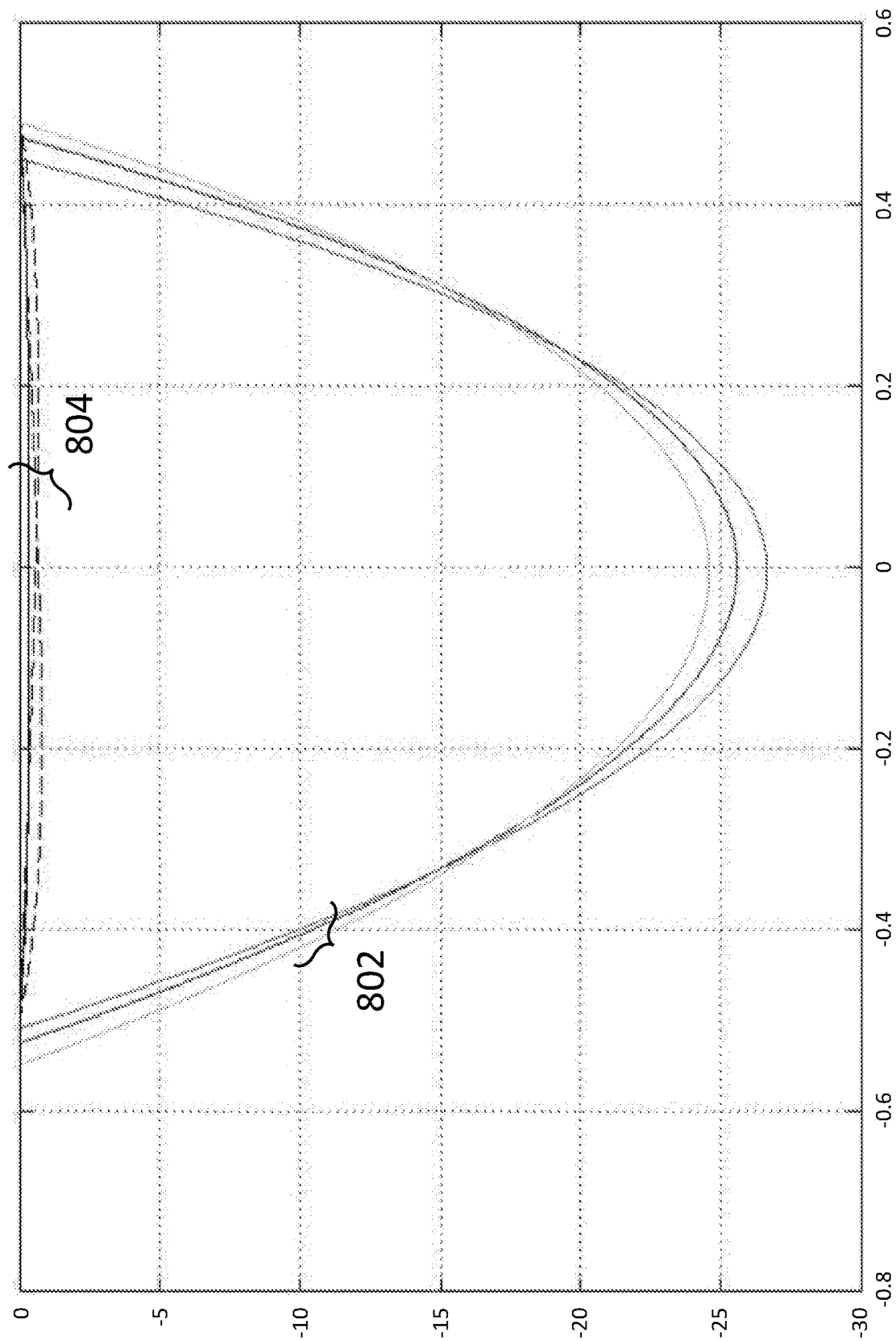
FIG. 8 shows the cumulative distributions for HD2 calibration before and after calibration of a second order non-linearity, according to some embodiments of the disclosure.

FIG. 8 shows the cumulative distributions for HD2 calibration before and after calibration of a second order non-linearity, according to some embodiments of the disclosure. Cumulative distributions are representative of integral non-linearity. Curves 802 are the cumulative distributions for HD2 calibration before calibration, and curves 804 are the cumulative distributions after HD2 calibration.

Since the errors represent a difference between the counts of the same output (i.e., output code) using two different changes to the input signal (i.e., adding $V_d$ and subtracting $V_d$ when the dither is positive and when the dither is negative, respectively), the errors will be independent of the input signal distribution. Provisions can be applied to ensure the disposal of old/stale data points and the "freshness" of the samples from both distributions (i.e., $+/-V_d$).

The error $\varepsilon_{HD2}$ for second order distortion, represented by the (partial) errors at the inspection points, is given by:

$$\varepsilon_{HD2} = \varepsilon_{HD2}(V_{insp}) + \varepsilon_{HD2}(-V_{insp}) \quad (11)$$

In other words, the error $\varepsilon_{HD2}$ is the sum of the errors at the two inspection points. Summing the errors can expose or accentuate the even order symmetry associated with second order non-linearity. The calibration technique can drive the error $\varepsilon_{HD2}$ to/towards zero to remove the second order distortion.

The error $\varepsilon_{HD2}$ can be incorporated in a LMS algorithm update equation to minimize the error (e.g., reduce the error to zero or drive the error towards zero, through progressively correcting the circuit based on the estimate of the component of the circuit), as follows:

$$\propto(n+1) = \propto(n) - \mu \times \varepsilon_{HD2} \quad (12)$$

where the update equation can update an estimate for a component of the circuit, e.g., the HD2 non-linearity $\propto$, based on the error $\varepsilon_{HD2}$ and a step size $\mu$.

For inspection points at any amplitude, the error $\varepsilon_{HD2}$ can be defined to accommodate different representations of the histograms and changes in polarities at large voltages. A suitable formula for $\varepsilon_{HD2}$ is as follows:

$$\varepsilon_{HD2} = [\text{Hist}_{V_{insp}}(V_{out} - \text{Dither})|_{Dither=V_d} \times V_{insp} + \text{Hist}_{-V_{insp}}(V_{out} + \text{Dither})|_{Dither=-V_d} \times (-V_{insp})][\varepsilon_{HD2}(V_{insp}) + \varepsilon_{HD2}(-V_{insp})]^2 \quad (13)$$

$\text{Hist}_a(b)$ represents a count or number of hits of b in bin a (i.e., count/number of hits of b having the value a). The error $\varepsilon_{HD2}$ as defined in equation (13) is a product of (1) a count of the output with the dither removed when the dither is positive having the value at the positive inspection point $V_{insp}$ times the value of the positive inspection point $V_{insp}$, plus a count of the output with the dither removed when the dither is negative having the value at the negative inspection point times the value of the negative inspection point and (2) squared value of the error defined in equation (11). This alternative formula for $\varepsilon_{HD2}$ highlights that variations on the error formulation are possible, and the variations are envisioned by the disclosure.

In addition, a parameter $HD2_{flag}$ can be calculated to isolate the HD2 from HD3 by enhancing the even symmetrical errors, which are due to HD2, while attenuating the odd symmetrical errors, which are characteristic of HD3.

$$HD2_{flag} = |\text{Cumsum}_{V_{insp}}(V_{out})|_{Dither=0} + \text{Cumsum}_{-V_{insp}}(V_{out})|_{Dither=0}| \quad (14)$$

The parameter $HD2_{flag}$ captures a sum of the count of the output less than or equal to the positive inspection point $V_{insp}$ and the count of the output less than or equal to the negative inspection point $-V_{insp}$, when the dither is zero. The error $\varepsilon_{HD2}$ and parameter $HD2_{flag}$ can be incorporated in a LMS update equation to minimize the error and form an estimate of the HD2 component of the circuit, as follows, utilizing the parameter $HD2_{flag}$:

$$\propto(n+1) = \propto(n) - \mu \times \varepsilon_{HD2} \times HD2_{flag} \quad (15)$$

In practice, the error defined by equation (11) is adequate for HD2 estimation. However, equation (13) and additional parameter $HD2_{flag}$ defined in equation (14) are given as other examples to illustrate the flexibility of this approach.

That is, the error can be defined in a convenient/suitable way that extracts the non-linear shape using histograms/distributions and sample counting.

The corrected outputs can be modified as follows, in the digital domain, using the estimated second order non-linearity $\propto$ and a model for the second order non-linearity:

$$V_{out_{cal}}|_{Dither=\pm V_d} = V_{out}|_{Dither=\pm V_d} - \propto ((n+1) \times V_{out}^2|_{Dither=\pm V_d}) \quad (16a)$$

The correction is independent of the dither value, and accordingly, equation (16a) can be simplified as follows:

$$V_{out_{cal}} = V_{out} - \propto ((n+1) \times V_{out}^2) \quad (16b)$$

To account for the varied/higher order effects of the correction, a better correction can be applied using the formula (utilizing a more refined model for the non-linearities):

$$V_{out_{cal}}|_{Dither=V_d} = V_{out}|_{Dither=V_d} \\ - \propto (n+1) \times V_{out}^2|_{Dither=V_d} + 2 \propto^2 (n+1) \times V_{out}^3|_{Dither=V_d} \quad (17a)$$

and $$V_{out_{cal}}|_{Dither=-V_d} = V_{out}|_{Dither=-V_d} \\ - \propto (n+1) \times V_{out}^2|_{Dither=-V_d} + 2 \propto^2 (n+1) \times V_{out}^3|_{Dither=-V_d} \quad (17b)$$

The correction is independent of the dither value, and accordingly, equations (17a) and equations (17b) can be simplified as follows:

$$V_{out_{cal}} = V_{out} - \propto((n+1) \times V_{out}^2 + 2\propto^2(n+1) \times V_{out}^3) \quad (18)$$

The updated output signals $V_{out_{cal}}$ can be used in future estimates of the error (in other words, calibration is being performed in a closed-loop form), as follows:

$$\varepsilon_{HD2}(V_{insp}) = \text{Cumsum}_{V_{insp}}(V_{out_{cal}} - \text{Dither})|_{Dither=V_d} - \\ \text{Cumsum}_{V_{insp}}(V_{out_{cal}} - \text{Dither})|_{Dither=V_d} \quad (19a)$$

and $$\varepsilon_{HD2}(-V_{insp}) = \text{Cumsum}_{-V_{insp}}(V_{out_{cal}} - \text{Dither})|_{Dither=-V_d} - \text{Cumsum}_{-V_{insp}}(V_{out_{cal}} - \text{Dither})|_{Dither=V_d} \quad (20a)$$

Alternatively, the future estimates of the error can be defined as follows:

$$\varepsilon_{HD2}(V_{insp}) = \text{Cumsum}_{V_{insp}}(V_{out_{cal}} - \text{Dither})|_{Dither=V_d} - \\ \text{Cumsum}_{V_{insp}}(V_{out_{cal}})|_{Dither=0} \quad (19b)$$

and $$\varepsilon_{HD2}(-V_{insp}) = \text{Cumsum}_{-V_{insp}}(V_{out_{cal}} - \text{Dither})|_{Dither=-V_d} - \text{Cumsum}_{-V_{insp}}(V_{out_{cal}})|_{Dither=0} \quad (20b)$$

Exposing and Extracting Third Order Distortion

For third order distortion, the same inspection points as those used for second order distortion HD2, e.g., positive inspection point $V_{insp}$ and negative inspection point $-V_{insp}$, can be used. Alternatively, the inspection points can be chosen to be at multiple amplitudes, e.g., some dither amplitude $+/-V_d$, another smaller dither amplitude, and zero dither. Generally speaking, the inspection points are chosen to expose the odd symmetry of a third order distortion.

In one example, on the digital backend, the number of points (e.g., histograms and cumulative probability distributions) of the output having amplitudes less than or equal to $+/-V_{insp}$ are calculated for the case when the dither is equal to positive dither $V_d$ (counting the number of points of the output after removing/subtracting the ideal/estimated dither value), output having amplitudes less than or equal to $+/-V_{insp}$ are calculated for the case when the dither is equal to negative dither $-V_d$ (counting the number of points of the output after removing/adding the ideal/estimated dither value), and/or the case when the dither is equal to zero (counting the number of points of the output with a zero dither). The difference of the counts/cumulative statistics for two cases (i.e., the two different dither values) is expected to be fixed and independent of the amplitude (i.e., independent of the input distribution). Therefore, the difference (which would be present in the presence of third order non-linearity) can qualify as a part of an "error signal" ε, and parts of the error signal are given by a (partial) error at the positive inspection point $V_{insp}$ and a (partial) error at the negative inspection point $V_{insp}$:

$$\varepsilon_{HD3}(V_{insp}) = \text{Cumsum}_{V_{insp}}(V_{out} - \text{Dither})|_{Dither=V_d} - \\ \text{Cumsum}_{V_{insp}}(V_{out})|_{Dither=0} \quad (21a)$$

and $$\varepsilon_{HD3}(-V_{insp}) = \text{Cumsum}_{-V_{insp}}(V_{out} - \text{Dither})|_{Dither=-V_d} - \\ \text{Cumsum}_{-V_{insp}}(V_{out})|_{Dither=0} \quad (22a)$$

and $$\varepsilon_{HD3} = \varepsilon_{HD3}(V_{insp}) - \varepsilon_{HD3}(-V_{insp}) \quad (23)$$

Alternatively, dither amplitudes of $+/-V_d$ can be used as the inspection points as was used for HD2. $\varepsilon_{HD3}(V_{insp})$, the (partial) error at the positive inspection point $V_{insp}$, is the difference in counts of the output less than or equal to the positive inspection point $V_{insp}$ between the two cases where the dither is positive and when the dither is zero. $\varepsilon_{HD3}(-V_{insp})$, the (partial) error at the negative inspection point $-V_{insp}$, is the difference in counts of the output less than or equal to the negative inspection point $-V_{insp}$ between the two cases where the dither is negative and when the dither is zero.

Instead of comparing the cases when the dither is positive and when the dither is zero, or when the dither is negative and when the dither is zero, $\varepsilon_{HD3}(V_{insp})$, the (partial) error at the positive inspection point $V_{insp}$, can be defined as the difference in counts of the output less than or equal to the positive inspection point $V_{insp}$ between the two cases where the dither is positive and when the dither is negative. $\varepsilon_{HD3}(V_{insp})$, the (partial) error at the negative inspection point $-V_{insp}$, can be defined as the difference in counts of the output less than or equal to the negative inspection point $-V_{insp}$ between the two cases where the dither is negative and when the dither is positive:

$$\varepsilon_{HD3}(-V_{insp}) = \text{Cumsum}_{V_{insp}}(V_{out} - \text{Dither})|_{Dither=V_d} - \\ \text{Cumsum}_{V_{insp}}(V_{out} - \text{Dither})|_{Dither=-V_d} \quad (21a)$$

and $$\varepsilon_{HD3}(-V_{insp}) = \text{Cumsum}_{-V_{insp}}(V_{out} - \text{Dither})|_{Dither=-V_d} - \\ \text{Cumsum}_{-V_{insp}}(V_{out} - \text{Dither})|_{Dither=V_d} \quad (22b)$$

As seen in equation (23), the error $\varepsilon_{HD3}$ is the difference of the errors at the two inspection points. The calibration technique can drive the error $\varepsilon_{HD3}$ to zero to remove the third order distortion. The main difference for extracting the error for HD3 from HD2 is the subtraction done in (23) as opposed to the addition done for HD2 extraction in (11). This is because of the odd symmetry of the HD3 non-linearity as opposed to the even symmetry of HD2 non-linearity.

The error for third order distortion $\varepsilon_{HD3}$ is used in an LMS update equation obtain new estimates for the third order distortion $\propto$ and minimize the error:

$$\propto(n+1)=\propto(n)+\mu\times\varepsilon_{HD3} \quad (24)$$

Additionally, to emphasize or enhance the HD3 pattern of odd symmetry, an $HD3_{flag}$ signal can be used:

$$HD3_{flag}=|\text{Cumsum}_{V_{insp}}(V_{out})|_{Dither=0}-\text{Cumsum}_{-V_{insp}}(V_{out})|_{Dither=0}| \quad (25)$$

The parameter $HD3_{flag}$ captures a difference of the count of the output less than or equal to the positive inspection point $V_{insp}$ and the count of the output less than or equal to the negative inspection point $-V_{insp}$, when the dither is zero. The error $\varepsilon_{HD3}$ and parameter $HD3_{flag}$ is incorporated in an LMS update equation to minimize the error and form an estimate of the HD3 component of the circuit, as follows:

$$\propto(n+1)=\propto(n)+\mu\times\varepsilon_{HD3}\times HD3_{flag} \quad (26)$$

To correct for third order non-linearity, the calibrated outputs are modified as follows:

$$V_{out_{cal}}|_{Dither=\pm Vd}=V_{out}|_{Dither=\pm V_d}-\propto(n+1)\times V_{out}^3|_{Dither=\pm V_d} \quad (27a)$$

The correction is independent of the dither value, and accordingly, equation (27a) can be simplified as follows:

$$V_{out_{cal}}=V_{out}-\propto(n+1)\times V_{out}^3 \quad (27b)$$

Figure 9:
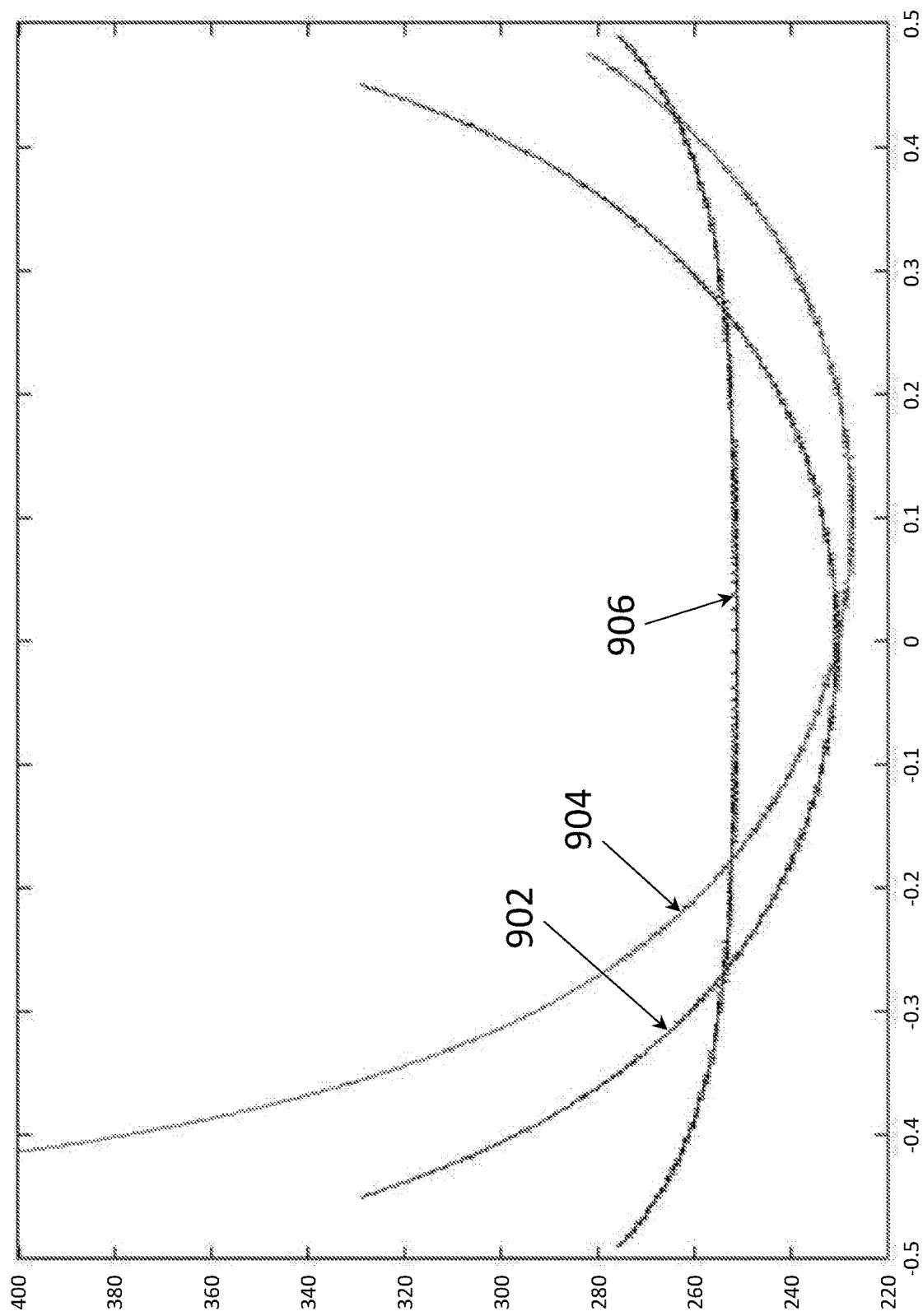
FIG. 9 shows histograms of $y_1$ and $y_2$ before and after calibration of a third order non-linearity, according to some embodiments of the disclosure, according to some embodiments of the disclosure.

FIG. 9 shows histograms of $y_1$ and $y_2$ before and after calibration of a third order non-linearity, according to some embodiments of the disclosure, according to some embodiments of the disclosure. Curves 902 and 904 are histograms before calibration. Curve 906 are histograms after calibration. Different dither values affect the output, which is evidence that the circuit is not linear. After calibration, the different dither values do not affect the output, which is evidence that the circuit is (more) linear after calibration.

Figure 10:
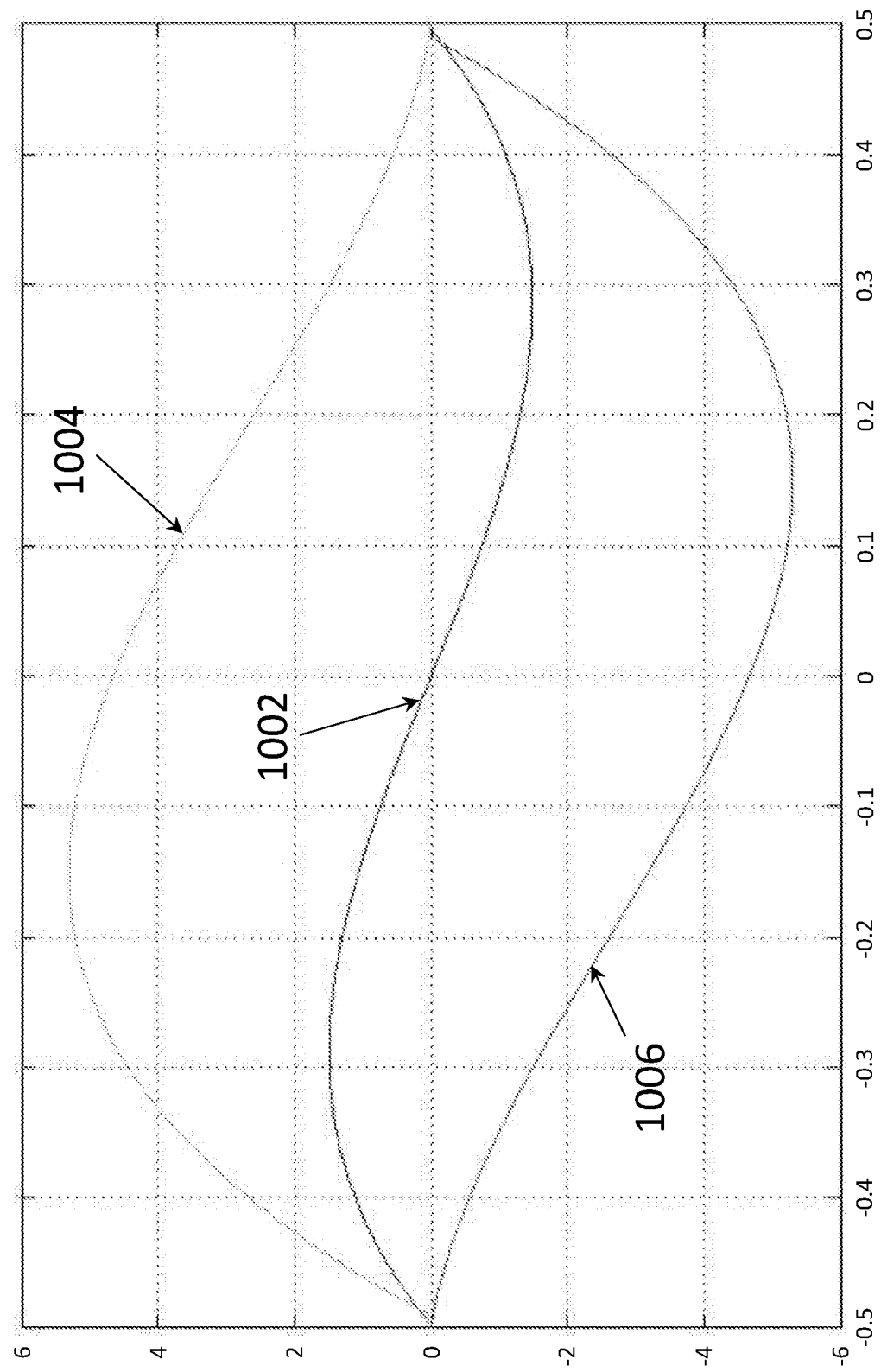
FIG. 10 shows cumulative distributions for HD3 distortion, according to some embodiments of the disclosure, according to some embodiments of the disclosure.

FIG. 10 shows cumulative distributions (INL) for HD3 distortion, according to some embodiments of the disclosure, according to some embodiments of the disclosure. Curve 1002 is a cumulative distribution for the case when dither is zero (or no dither). Curve 1004 is a cumulative distribution for the case when dither is positive. Curve 1006 is for the case with the dither subtracted.

Figure 11:
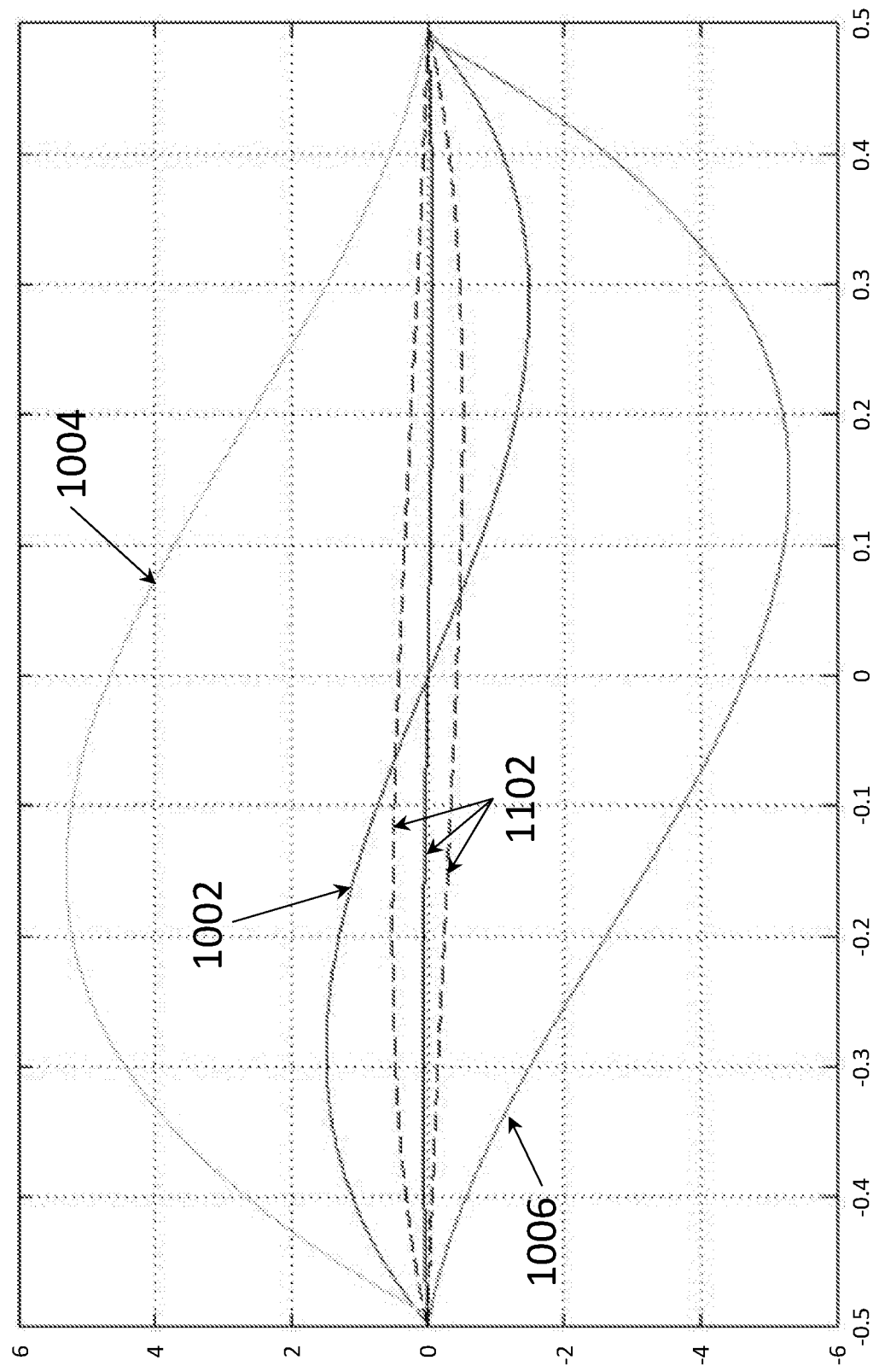
FIG. 11 shows cumulative distributions before and after HD3 calibration, according to some embodiments of the disclosure.

FIG. 11 shows cumulative distributions before and after HD3 calibration, according to some embodiments of the disclosure. Curves 1102 are the cumulative distributions after HD3 has been calibrated out, using equations (26), (27a), and (27b).

To account for the higher order effects of the correction, a (better) correction can be applied using the formulas:

$$V_{out_{cal}}|_{Dither=\pm V_d} = V_{out}|_{Dither=\pm V_d} \quad (28a)$$
$$-\propto(n+1)\times V_{out}^3|_{Dither=\pm V_d}+3\propto^2(n+1)\times V_{out}^5|_{Dither=\pm V_d}$$

and $$V_{out_{cal}}|_{Dither=0} = V_{out}|_{Dither=0} \quad (28b)$$
$$-\propto(n+1)\times V_{out}^3|_{Dither=0}+3\propto^2(n+1)\times V_{out}^5|_{Dither=0}$$

Equations (28a) and (28b) can correct for HD5 effect of the HD3 correction.

The correction is independent of the dither value, and accordingly, equations (28a) and (28b) can be simplified as follows:

$$V_{out_{cal}}=V_{out}-\propto(n+1)\times V_{out}^3+3\propto^2(n+1)\times V_{out}^5 \quad (29)$$

Figure 12:
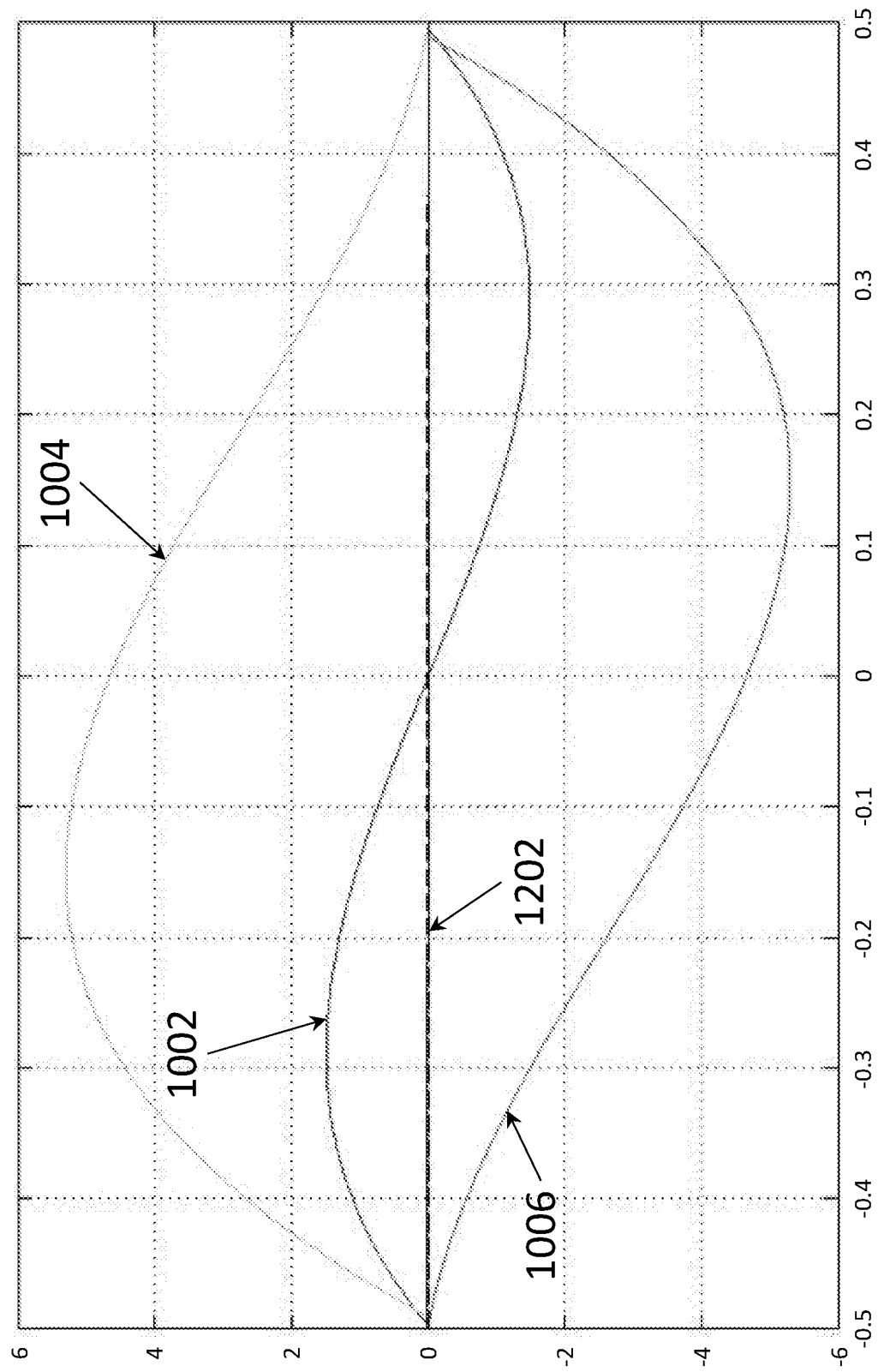
FIG. 12 shows cumulative distributions before and after a more refined HD3 calibration, according to some embodiments of the disclosure.

FIG. 12 shows cumulative distributions before and after a more refined HD3 calibration, according to some embodiments of the disclosure. Curves 1102 are the cumulative distributions after HD3 has been calibrated out, using equations (26), (28a), (28b), and (29).

The updated output signals $V_{out_{cal}}$ are used in future estimates of the error (in other words, calibration being performed in a closed-loop form), as follows, as an example:

$$\varepsilon(V_{insp})=\text{Cumsum}_{V_{insp}}(V_{out_{cal}}-\text{Dither})|_{Dither=V_d}-\text{Cumsum}_{V_{insp}}(V_{out_{cal}})|_{Dither=0} \quad (30)$$

Equation (30) reformulates equation 21a to use updated output signals $V_{out_{cal}}$ in error estimates. Equations (22a), (21b), and (22b) (and more broadly, other (partial) error estimation equations envisioned by the disclosure) can also be reformulated in a same fashion as equation (30) to use updated output signals $V_{out_{cal}}$ in error estimates.

Exposing and Extracting Fifth Order Distortion (and Fourth Order Distortion)

The model for fifth order distortion on the output can be defined as:

$$v_{out}=\propto_1 x+\propto_3 x^3+\propto_5 x^5 \quad (31)$$

$\propto_1$ is an estimate of a first order distortion of the circuit, $\propto_3$ is an estimate of a third order distortion of the circuit, and $\propto_5$ is an estimate of the fifth order distortion of the circuit. The output can be corrected using the following approximate formula:

$$v_{out_{corr}}=V_{out}-\gamma_3 v_{out}^3-\gamma_5 v_{out}^5-\gamma_7 v_{out}^7-\gamma_9 v_{out}^9 \quad (32)$$

Such that, if $\propto_1=1$:

$$\gamma_3=\propto_3 \quad (33)$$

and $$\gamma_5=\propto_5-3\gamma_3^2 \quad (34)$$

and $$\gamma_7=-3\gamma_3^3-5\gamma_3\gamma_5-3\gamma_3\propto_5 \quad (35)$$

and $$\gamma_9=-\gamma_3^4-16\gamma_3^2\gamma_5-5\gamma_5\propto_5 \quad (36)$$

The estimation of the third order non-linearity can be performed as described herein. The detection of the fifth order non-linearity occurs in a manner similar to the third order but using a larger inspection point (an inspection point having a larger magnitude than the ones used for extracting the third order non-linearity). If $V_{insp1}$ was used for extracting the third order non-linearity, then the inspection point to extract the fifth order non-linearity, $V_{insp5}$, is $V_{insp5}>|V_{insp1}|$, since fifth order distortion tends to show more severe compression near large amplitudes compared to third order distortion. In addition, the convergence is to be done such that third order convergence happens first, followed by fifth order convergence. The error estimation equations are given by:

$$\varepsilon_{HD5}(V_{insp5})=\text{Cumsum}_{V_{insp5}}(V_{out}-\text{Dither})|_{Dither=V_d}-\text{Cumsum}_{V_{insp5}}(V_{out})|_{Dither=0} \quad (37a)$$

and $$\varepsilon_{HD5}(-V_{insp5})=\text{Cumsum}_{-V_{insp5}}(V_{out}-\text{Dither})|_{Dither=-V_d}-\text{Cumsum}_{-V_{insp5}}(V_{out})|_{Dither=0} \quad (38a)$$

$\varepsilon_{HD5}(V_{insp5})$, the (partial) error at the positive inspection point $V_{insp5}$, is the difference in counts of the output less than or equal to the positive inspection point $V_{insp5}$ between the two cases where the dither is positive and when the dither is zero. $\varepsilon_{HD5}(V_{insp5})$, the (partial) error at the negative inspection point $-V_{insp5}$, is the difference in counts of the output less than or equal to the negative inspection point $-V_{insp5}$ between the two cases where the dither is negative and when the dither is zero.

Instead of comparing the cases when the dither is positive and when the dither is zero, or when the dither is negative and when the dither is zero, $\varepsilon_{HD5}(V_{insp5})$, the error at the positive inspection point $V_{insp5}$, can be defined as the difference in counts of the output less than or equal to the positive inspection point $V_{insp5}$ between the two cases where the dither is positive and when the dither is negative. $\varepsilon_{HD5}(-V_{insp5})$, the error at the negative inspection point $-V_{insp5}$, can be defined as the difference in counts of the output less than or equal to the negative inspection point $-V_{insp5}$ between the two cases where the dither is negative and when the dither is positive:

$$\varepsilon_{HD5}(V_{insp5}) = \text{Cumsum}_{V_{insp5}}(V_{out}-\text{Dither})|_{Dither=V_d} - \text{Cumsum}_{V_{insp5}}(V_{out}-\text{Dither})|_{Dither=-V_d} \quad (37b)$$

and $$\varepsilon_{HD5}(-V_{insp5}) = \text{Cumsum}_{-V_{insp5}}(V_{out}-\text{Dither})|_{Dither=-V_d} - \text{Cumsum}_{V_{insp5}}(V_{out}-\text{Dither})|_{Dither=V_d} \quad (38b)$$

Then, the error is defined as:

$$\varepsilon_{HD5} = \varepsilon_{HD5}(V_{insp5}) - \varepsilon_{HD5}(-V_{insp5}) \quad (39)$$

In other words, the error $\varepsilon_{HD5}$ is the difference of the errors at the two inspection points, as computed by the partial errors illustrated in equations (37a), (37b), (38a), and (38b). The calibration technique can drive the error $\varepsilon_{HD5}$ to zero to remove the fifth order distortion.

The error $\varepsilon_{HD5}$ is incorporated in an LMS update equation to minimize the error and update the distortion estimate $\propto$ (estimate of the HD5 component of the circuit), as follows:

$$\propto(n+1) = \propto(n) + \mu \times \varepsilon_{HD5} \quad (40)$$

Similarly, this approach can be used to extract higher order terms or terms not mentioned herein for the sake of brevity. For example, the detection of the fourth order non-linearity occurs in a manner similar to the second order but using a larger inspection point (an inspection point having a larger magnitude than the ones used for extracting the second order non-linearity, or $V_{insp4} > |V_{insp1}|$), since fourth order distortion tends to show more severe compression near large amplitudes compared to second order distortion. In addition, the convergence is to be done such that second order convergence happens first, followed by fourth order convergence. The error for HD4 can be defined as a sum of the partial errors at the two inspection points.

Broadly speaking, the calibration technique identifies the shape or pattern of the given non-linearity, then applies a histogram and/or cumulative distribution based calculation that captures the shape/pattern for different dither values to extract and correct for the non-linearity.

Extracting and Calibrating Gain Information

Besides exposing non-linearity, counts such as histograms and cumulative distributions and comparing the counts between dither values can be used to estimate the gain as well (gain being another component of the circuit being calibrated). In some cases, the gain is not ideal, and may need to be corrected. In other words, the calibration scheme can also extract the first order term, not just the high order non-linear terms. In some cases, extracting for the first order term can help ensure the accurate convergence of the non-linear terms. In other approaches, a correlation method correlating a dither against a signal is used to estimate the gain term using the equation:

$$G_e[n+1] = G_e[n] + \mu \cdot V_d[n] \cdot (V_{out}[n] - G_e[n] \cdot V_d[n]) \quad (41)$$

This equation (41) estimates the overall average gain of the whole transfer characteristics, which can be affected by any non-linearity that exists.

Using the histogram/counting technique, the gain can be estimated by choosing the inspection point to be at zero. That is: $V_{insp1} = 0$. This is because near zero, the output is exposed to minimal non-linearity. The error terms obtained by placing inspection at zero can isolate the real linear gain error from the gain error due to compression/expansion of the non-linear residue. It also ensures that the gain convergence proceeds in the right direction and always helps the non-linear error convergence.

Using the histogram method, the (partial) errors can be defined as:

$$\varepsilon(0+) = \text{Cumsump}_{0+}(V_{out}-\text{Dither}_{est})|_{Dither=-Vd} - \text{Cumsump}_{0+}(V_{out}-\text{Dither}_{est})|_{Dither=+Vd} \quad (42)$$

and $$\varepsilon(0-) = \text{Cumsumn}_{0-}(V_{out}-\text{Dither}_{est})|_{Dither=-Vd} - \text{Cumsump}_{0-}(V_{out}-\text{Dither}_{est})|_{Dither=+Vd} \quad (43)$$

$\text{Cumsumn}_{0-}$ is the cumulative count below 0, and $\text{Cumsump}_{0+}$ is the cumulative count above 0. $\varepsilon(0+)$, the first (partial) error at the zero inspection point $V_{insp1}=0$ is the difference in counts of the output below zero between the two cases where the dither is negative and when the dither is positive. $\varepsilon(0-)$, the second (partial) error at the zero inspection point $V_{insp1}=0$ is the difference in counts of the output above zero between the two cases where the dither is negative and when the dither is positive. In this case, the output is the output with an estimate of the dither removed, i.e., $V_{out}[n]-\text{Dither}_{est}$. The estimate of the dither is the dither value $V_d[n]$ multiplied by a gain estimate $G[n]$ If the dither is positive, the output with the estimate of the dither removed is $V_{out}-G[n]V_d$. If the dither is negative, the output with the estimate of the dither removed is $V_{out}+G[n]V_d$. Note that the two partial errors can examine non-overlapping ranges.

The gain error term $\varepsilon_G$ is defined as:

$$\varepsilon_G = \varepsilon(0+) - \varepsilon(0-) \quad (44)$$

In other words, the error $\varepsilon_G$ is the difference of the first (partial) error and the second (partial) error. The error $\varepsilon_G$ can be incorporated into a LMS update equation to compute the gain estimate of the circuit:

$$G[n+1] = G[n] - \mu_g \times \varepsilon_G \quad (45)$$

where $\mu_g$ is the LMS step size for the gain convergence. It should be noted that once the convergence is complete and the gain estimate value of $G[n]$ is obtained, the output needs to be multiplied by $(1/G[n])$ to remove any linear errors.

If the linear error equations shown above are used with non-zero inspection points, the converged value of $G[n]$ would correspond to the linear correction factor at that inspection point on the residue curve. Exemplary partial errors at non-zero inspection points (e.g., $V_{inspg}$) can be defined as:

$$\varepsilon(V_{inspg2}+) = \text{Cumsump}_{V_{inspg2}+}(V_{out}[n] - \text{Dither}_{est})|_{Dither=-Vd} - \text{Cumsump}_{V_{inspg2}+}(V_{out}[n] - \text{Dither}_{est})|_{Dither=+Vd} \qquad (46)$$

and $$\varepsilon(V_{inspg2}-) = \text{Cumsump}_{V_{inspg2}-}(V_{out}[n] - \text{Dither}_{est})|_{Dither=-Vd} - \text{Cumsump}_{V_{inspg2}-}(V_{out}[n] - \text{Dither}_{est})|_{Dither=+Vd} \qquad (47)$$

Cumsumn$_{V_{inspg}-}$ is the cumulative count below $V_{inspg}$, and Cumsump$_{V_{inspg}+}$ is the cumulative count above $V_{inspg}$. $\varepsilon(V_{inspg2}+)$, the first (partial) error at the non-zero inspection point $V_{inspg2}$ is the difference in counts of the output below $V_{inspg2}$ between the two cases where the dither is negative and when the dither is positive. $\varepsilon(V_{inspg2}-)$, the second (partial) error at the non-zero inspection point $V_{inspg2}$ is the difference in counts of the output above $V_{inspg2}$ between the two cases where the dither is negative and when the dither is positive. The gain error term $\varepsilon_G$ is defined as:

$$\varepsilon_{G2} = \varepsilon(V_{inspg2}+) - \varepsilon(V_{inspg2}-) \qquad (48)$$

In other words, the error $\varepsilon_{G2}$, i.e., the error at the non-zero inspection point $V_{insp2}$ is the difference of the first (partial) error and the second (partial) error. The error $\varepsilon_{G2}$ can be incorporated into a LMS update equation to compute the gain estimate at the inspection point $V_{insp2}$:

$$G_2[n+1] = G_2[n] - \mu_{g2} \times \varepsilon_{G2} \qquad (49)$$

where $\mu_g$ is the LMS step size for the gain convergence.

If gain error calibration is run on a non-linear residue (e.g., $V_{out}[n] - \text{Dither}_{est}$) with uniformly distributed inspection points picked randomly throughout LMS convergence, the final value of G[n] would represent the average gain of the output.

The advantage of the histogram/counting method (i.e., compare estimates of the transfer characteristics for different dither values) over the traditional correlation method (i.e., cross-correlate the dither amplitude with a signal amplitude) is that it estimates the gain at the inspection point, instead of the average gain of the whole transfer characteristics. Therefore, it is less sensitive to errors due to the non-linear effects. In addition, it is much simpler and cheaper to implement because it relies on counters, instead of multiplication (which would be needed for cross-correlations).

By estimating the gain at multiple inspection points using the histogram/counting method described, a piece-wise linear estimate of the non-linear transfer characteristic can be obtained for an arbitrary non-linear function, regardless of its shape or order. The piece-wise linear estimates can be used to correct the output in a piece-wise manner, by applying correction coefficients that correspond to different ranges of the output.

Variations to the Partial Error Calculations, Error Formulations, and LMS Equation Formulations The examples herein merely illustrate exemplary implementations for carrying out the counting or histogram-based approach. Other solutions are envisioned by the disclosure.

Partial error equations can differ from one implementation to another. Primarily, the partial error equations compare counts/histograms between different values of the dither. However, the values of the dither chosen for the comparison can depend on the implementation. For instance, in various partial error equations, certain values of the dither are chosen for the comparison. For instance, equation (9a) compares the counts when the dither is positive and when the dither is negative. Equation (10a) compares the counts when the dither is negative and when the dither is positive. Equation (9b) compares the counts when the dither is positive and when the dither is zero. Equation (10b) compares the counts when the dither is negative and when the dither is zero. The choice of the values of the dither can vary from one implementation to another. Also, the choice of the values of the dither can depend on the type of non-ideality to be extracted and how the error equations are formulated to extract the non-ideality. Preferably, the values of the dither used in the comparison are chosen done to expose or accentuate the shape or pattern associated with the non-ideality. Certain values of the dither signal can result in greater amount of distortion in the output. Choosing those values of the dither signal for the comparison that can cause the greater amount of distortion can make extracting the shape or pattern associated with the non-ideality easier and more effective.

Likewise, the definitions of the partial error equations or parameters can vary from one implementation to another. Primarily, partial error equations define ranges based on inspection points, and compare counts/histogram-based on the ranges. Also, as illustrated by the examples herein, the definitions of the partial error equations can depend on the type of non-ideality to be extracted. In some cases, various partial error equations or equations defining an error at a given inspection point can use overlapping ranges. The type of ranges used in partial error equations can differ from one implementation to another. Alternatively, non-overlapping ranges can be used. Instances of $\text{Cumsum}_{V_{insp}}(.)$ for the positive inspection point $V_{insp}$ can be replaced by $\text{Cumsump}_{V_{insp}}$, where $\text{Cumsump}_x(y)$ is the cumulative histogram (i.e., count) of digital codes of digital signal y greater than or equal to x. Instances of $\text{Cumsum}_{-V_{insp}}(.)$ for the negative inspection point $-V_{insp}$ can be replaced by $\text{Cumsum}_{-V_{insp}}$, where $\text{Cumsumn}_x(y)$ is the cumulative histogram (i.e., count) of digital codes of digital signal y less than or equal to x. The parameters enhancing even and odd symmetrical errors can also be varied in the same manner to use non-overlapping ranges.

Similarly, the error formulations based on the partial errors can vary from one implementation to another. Preferably, the error equations are defined in such a way to combine partial errors and to expose or accentuate the shape or pattern associated with the non-ideality. For instance, the error equation for error $\varepsilon_{HD2}$ is the sum of the errors at the two inspection points. Summing the errors exposes or accentuates the even order symmetry associated with second order non-linearity. The error equation for $\varepsilon_{HD3}$ is the difference of the errors at the two inspection points. The difference in the errors exposes or accentuates the odd order symmetry associated with third order non-linearity. The two errors, $\varepsilon_{HD2}$ and $\varepsilon_{HD3}$ are defined in opposite manner of each other to expose the difference in even and odd symmetries associated with the second order non-linearity and third order non-linearity respectively. The opposite equation formulations can also be used in exposing the difference in symmetries for other pairs of error equations and non-linearities. Other error formulations are possible so long as they are defined in such a way to expose or accentuate the different shapes associated with various non-idealities. Many examples herein illustrate the flexibility in the approach.

Moreover, the LMS update equations can vary from one implementation to another. Many examples herein illustrate the flexibility in the approach (e.g., HD2$_{flag}$ can be used as part of the LMS equation. Moreover, depending on the sign of the error (e.g., $\varepsilon_{HD2}$) used in the LMS equation, the LMS equation can be defined to add or subtract the step size multiplied by the error (e.g., $\mu \times \varepsilon_{HD2}$), as long as addition or subtraction is set as negative feedback in the LMS loop converges.

Implementing Cumulative Histograms Efficiently in Digital Hardware

Many of the equations described herein utilizes cumulative histograms defined by inspection points, i.e., accumulating/keeping a count of the output falling within a range defined by an inspection point, and the counts or cumulative histograms are computed based on a block of data or many samples. Moreover, the error and/or partial errors are defined by a comparison of counts associated with different values of the dither. In other words, counting and comparing the counts for different dither values (e.g., positive dither and negative dither) helps to extract shape/pattern of a non-linearity or gain error at a given inspection point. Calibrating based on a block of data can be robust (making sure that calibrations do not diverge easily, since the errors are being extracted based on data gathered over a period of time), but it also means that calibration can take more time, and keeping/accumulating counts for many samples can add complexity.

Counting the output with the dither removed falling within a range defined by an inspection point and comparing counts between different values of the dither signal can be implemented in digital hardware efficiently, if counting and comparing counts are done incrementally or sample-by-sample (as opposed to computing a cumulative histogram over a large block of data). Incremental or sample-by-sample counting and updating an LMS equation at each sample can still converge to minimize the error and update the estimate of the component of the circuit within the calibration loop. Defining and implementing the partial errors and errors to count sample-by-sample, while preserving the effect of comparing counts between different dither values, is not trivial. The incremental or sample-by-sample counting and comparisons is a special case or implementation of the histogram technique.

Instead of counting over a large block of data and determining how many samples fall within a range defined by an inspection point, incremental or sample-by-sample counting can determine whether each sample, i.e., the output with the dither removed, is a hit within the range defined by the inspection point. If the sample, i.e., the output with the dither removed, is a hit, then a value can be assigned to count the sample. Moreover, the comparison between counts can be performed incrementally if a value of +1 is assigned to a hit for one dither value, and a value of −1 is assigned to a hit for another dither value. The opposite values, e.g., +1 and −1, can represent an incremental difference/comparison being made between the two dither cases. As each sample is counted and the LMS equation is updated, the calibration loop can converge to a steady state to make sure that the number of hits resulting in a +1 and the number of hits resulting in a −1 are equalized. When the steady state is reached, it is as if the counts between different values of the dither signal are equal, and thus the LMS update equation would stabilize and converge to an appropriate estimate of a component of the circuit. The calculation can be simplified even further if a positive dither and a negative dither is used, since a sign bit of the dither can be used to represent +1 and −1. Accordingly, formulating partial errors and errors and updating an LMS equation using the sign bit of the dither for each hit, can effectively yield the same effect as counting and comparing counts between different dither values.

To implement incremental counting, various error estimate equations, each forming a partial errors at a given inspection point, e.g., inspection points $V_{insp}$ and $-V_{insp}$, based on cumulative histograms (i.e., count of values with a range defined by the given inspection point) and a difference between two cumulative histograms, can be defined differently, as follows:

$$\varepsilon(V_{insp}) = \mathrm{sign}(\mathrm{Dither} = \pm V_d) \cdot \mathrm{hit}_{>V_{insp}}(V_{out} - \mathrm{Dither}_{est}) \quad (50)$$

and $$\varepsilon(-V_{insp}) = \mathrm{sign}(\mathrm{Dither} = \pm V_d) \cdot \mathrm{hit}_{<-V_{insp}}(V_{out} - \mathrm{Dither}_{est}) \quad (51)$$

$\mathrm{hit}_{>x}(y)$ returns 1 if y is greater than or equal to x, and returns 0 otherwise. $\mathrm{hit}_{<x}(y)$ returns 1 if y is less than or equal to x, and returns 0 otherwise. Dither can have a positive dither value, e.g., $+V_d$, or a negative dither value, e.g., $-V_d$. Accordingly, sign(Dither) returns +1 if the dither is a positive dither, and sign(Dither) returns −1 if the dither is a negative dither. If the output with the dither removed, e.g., $V_t$ Dither, is a hit within the range defined by the inspection point (e.g., greater than or equal to the inspection point $V_{insp}$, or less than or equal to the inspection point $-V_{insp}$), then the sign of the dither value is the partial error at the inspection point. If the output with the dither removed, e.g., $V_{out}$–Dither, is not a hit within the range defined by the inspection point, then the partial error at the inspection point is zero.

The above partial errors computed incrementally or sample-by-sample as illustrated above can be used in equations (11) and (23) and (39) to estimate errors for HD2, HD3, and HD5, or other terms that combine partial errors defined at the inspection points.

The errors for gain estimation, e.g., errors at zero inspection point or errors at non-zero inspection points, can also be implemented efficiently in hardware. The partial errors are also performing counting and comparisons. For any given inspection point, the partial errors can be defined as follows:

$$\varepsilon(V_{inspg2}+) = \mathrm{sign}(\mathrm{Dither} = \pm V_d) \cdot \mathrm{hit}_{>V_{inspg2}}(V_{out} - \mathrm{Dither}_{est}) \quad (52)$$

and $$\varepsilon(V_{inspg2}-) = \mathrm{sign}(\mathrm{Dither} = \pm V_d) \cdot \mathrm{hit}_{<V_{inspg2}}(V_{out} - \mathrm{Dither}_{est}) \quad (53)$$

$\mathrm{hit}_{>x}(y)$ returns 1 if y is greater than or equal to x, and returns 0 otherwise. $\mathrm{hit}_{<x}(y)$ returns 1 if y is less than or equal to x, and returns 0 otherwise. Dither can have a positive dither value, e.g., $+V_d$, or a negative dither value, e.g., $V_d$. Accordingly, sign(Dither) returns +1 if the dither is a positive dither, and sign(Dither) returns −1 if the dither is a negative dither. For partial error $\varepsilon(V_{inspg2}+)$, the range is defined by the output greater than or equal to $V_{inspg2}$. For partial error $\varepsilon(V_{inspg2}-)$, the range is defined by the output less than or equal to $V_{inspg2}$. The ranges are not overlapping. For partial error $\varepsilon(V_{inspg2}+)$, if the output with the dither removed, e.g., $V_{out}$–Dither$_{est}$, is a hit within the range defined by the inspection point (e.g., greater than or equal to $V_{inspg2}$), then the sign of the dither value is the partial error at the inspection point. Otherwise, partial error $\varepsilon(V_{inspg2}+)$ is 0. For partial error $\varepsilon(V_{inspg2}-)$, if the output with the dither removed, e.g., $V_{out}$–Dither$_{est}$, is a hit within the range defined by the inspection point (e.g., less than or equal to $V_{inspg2}$), then the sign of the dither value is the partial error at the inspection point. Otherwise, partial error $\varepsilon(V_{inspg2}-)$ is 0.

When the inspection point is at zero, e.g., $V_{insp1}=0$, the implementation for incrementally counting the hits for partial error $\varepsilon(0+)$ and partial error $\varepsilon(0-)$ can become:

$$\varepsilon(0+)=\text{sign}(\text{Dither}=\pm V_d)\cdot \text{pos?}(V_{out}-\text{Dither}_{est}) \qquad (54)$$

and $$\varepsilon(0-)=\text{sign}(\text{Dither}=\pm V_d)\cdot \text{neg?}(V_{out}-\text{Dither}_{est}) \qquad (55)$$

When the inspection point is zero, the sign bit of the output with the dither estimate removed (e.g., $V_{out}-\text{Dither}_{est}$) can enable hardware to easily determine whether the output with the dither estimate be removed is a hit or not a hit within the range set by a zero inspection point. Accordingly, when the inspection point is zero and the range is defined by a zero inspection point, the digital implementation can be a special case. When the range is defined by zero, whether the output with the dither estimate removed is positive or negative (as indicated by pos?(.) and neg?(.) respectively) can indicate whether the output with the dither estimate removed is a hit or not a hit. The operation pos?(y) can return a 1 if y is positive, and return a zero otherwise. The operation neg?(y) can return a 1 if y is negative, and return a zero otherwise. Specifically, pos?(.) and neg?(.) can be implemented as a digital/logical operation that examines the sign bit of the output with the dither removed, and determines whether the output with the dither estimate removed is a hit within the range or not a hit within the range (without having to perform a comparison). If the output with the dither removed, e.g., $V_{out}-\text{Dither}_{est}$, is a positive, then $\varepsilon(0+)$ has the sign of the dither value is the partial error at the inspection point. $\varepsilon(0+)$ is otherwise zero. If the output with the dither removed, e.g., $V_{out}-\text{Dither}$, is negative, then $\varepsilon(0-)$ has the sign of the dither value. $\varepsilon(0-)$ is otherwise 0.

The error estimate at the zero inspection point, e.g., $\varepsilon_G$ from equation (44), can be further simplified to:

$$\varepsilon_G=\varepsilon(0+)-\varepsilon(0=\text{sign}(\text{Dither}=\pm V_d)\cdot\text{sign}(V_{out}-\text{Dither}_{est}) \qquad (56)$$

In other words, the error estimate at the zero inspection point (e.g., for gain), can be done by logically combining the sign bit of the dither and the sign bit of the output with the dither removed by an "AND" operation. This error estimate at the zero inspection point can be used to update an LMS equation that updates the estimate of the component of the circuit, such as equation (45).

Technical Advantages

The calibration technique based on histograms and/or cumulative distributions at inspection points can converge substantially faster than traditional correlation-based methods that rely on multiple dither signals. Furthermore, the counts at chosen inspection points expose the non-idealities of the system without being dependent on the input distribution. As a result, calibrations are independent of the input signal distribution and whether the input is present or not. In the absence of an input signal, a multi-level dither can be used for calibration. The different calculations based on counts of the output at the inspection points based on different dither values can effectively separate and extract distortion terms such as the second, third, and fifth order distortion. The calibration technique can estimate both the HD2, HD3, HD5, etc. distortions reasonably accurately, even when all are present simultaneously. The additive dither being used for the calibrations mean no drastic changes to the analog design is needed, and only circuitry for injecting and removing the additive dither is needed. Such circuitry is usually available for dithering out errors in the system (e.g., to dither out ADC errors) anyway. More importantly, the calibration technique can be used on any circuit where dither is injected and removed. Examples of such circuits can include: buffer, track and hold, MDAC, etc. Some techniques can be applied to an MDAC amplifier only, but not other circuits. The calibration technique relies on the shape or pattern that shows up in the output based on different dither cases, and can effectively estimate and correct arbitrary non-linearities. Using the combination of gain and non-linear estimates, the technique is capable of estimating and correcting arbitrary non-linear shapes regardless of their order.

The calibration technique is characterized by many distinguishing features. First, the calibration technique uses an existing dither signal to expose and estimate the non-linearity in a counting approach that correlates the output with the dither removed associated with different values of the dither (but not a traditional correlation-based approach that cross-correlates the dither amplitude against the output amplitude). The counting approach examines the output in the presence of different values of the dither, correlates the output when the dither is one value against the output when the dither is another value, at specific inspection points. Notably, the counting approach does not depend on input signal statistics. Rather, the counting approach depend on the dither. The dither-dependent, counting approach, makes this calibration technique independent on the input distribution. An added benefit of this scheme is that the calibration technique can even operate in the absence of an input signal. Second, the calibration technique can isolate the second, third, fifth, and higher order components accurately in a deterministic framework without making analog changes. Specifically, the inspection points for the calibration technique are carefully selected to expose the shape/pattern associated with various non-ideal components of the circuit. Third, the calibration technique applies efficient and effective calculations defined to extract errors for HD2, HD3, and HD5 for any inspection point and in the presence of dither. A suitable technique to drive the errors to zero, such as LMS framework, can be used. Besides, the calibration technique can be extended to obtain a gain estimate. The overall calibration approach can estimate and correct arbitrary non-linearities using the combination of gain and non-linear estimates at multiple inspection points. Fourth, correlation-based approaches typically try to minimize the squared error over a whole output range, whereas the calibration approach based on counting at a specific inspection point results in estimation of the behavior at a specific point in the output, which can lead to better accuracy when it comes to extracting errors.

Examples

Example 1 is a calibration system, comprising: dither circuitry for injecting a dither at an input of a circuit and removing the dither at an output of the circuit; counting circuitry for accumulating counts of an output within ranges defined by one or more inspection points of the output; error circuitry for comparing counts associated with different values of the dither and determining an error estimate; and calibration circuitry for driving the error estimate towards zero.

Figure 13:
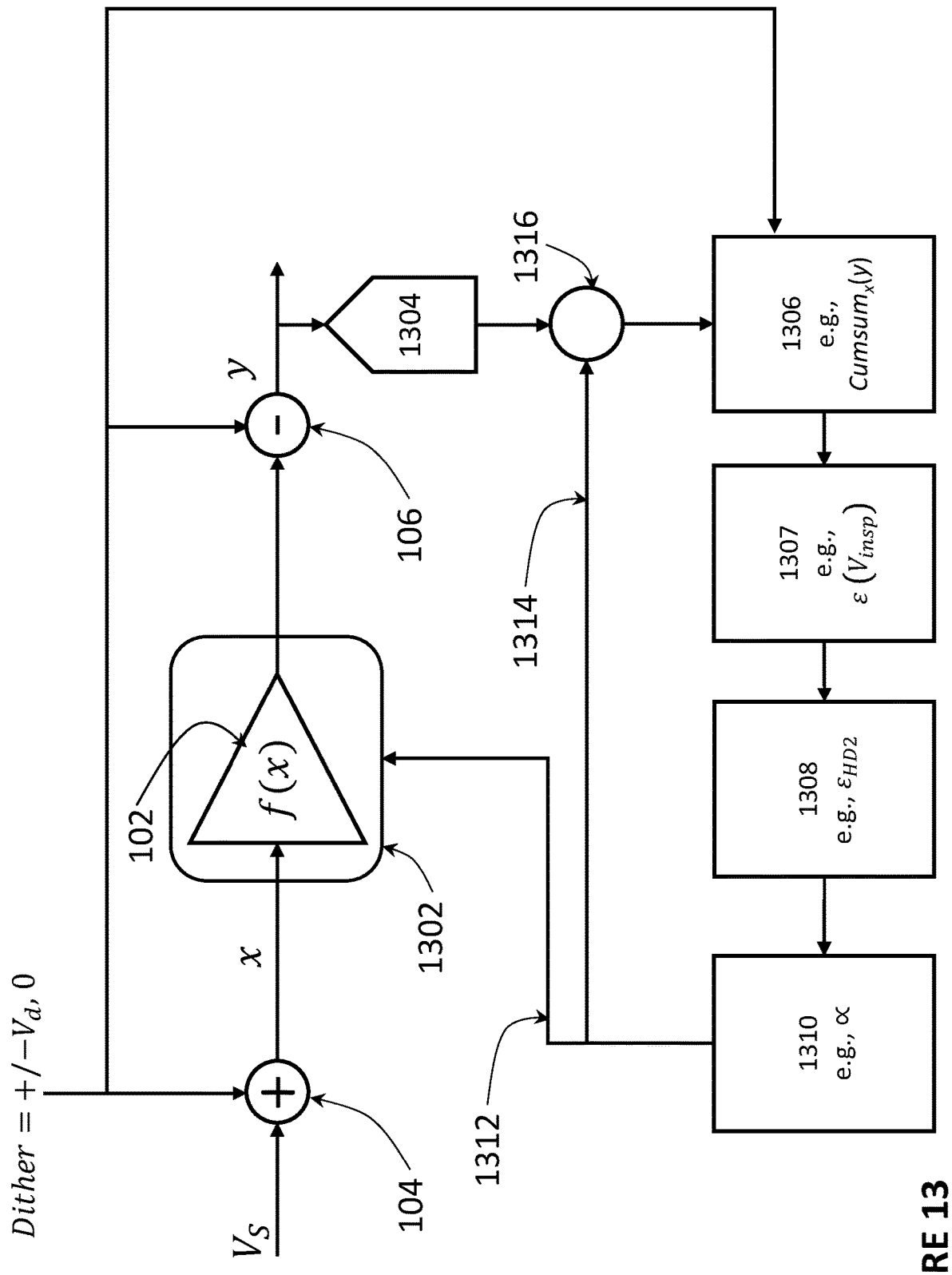
FIG. 13 illustrates a calibration system, according to some embodiments of the disclosure.

FIG. 13 illustrates a calibration system, according to some embodiments of the disclosure. The calibration system can be used to calibrate circuit 1302. The dither circuitry corresponds to summer 104 and subtractor 106. Optionally, the calibration system includes an ADC 1304 that digitizes an (analog) output of the circuit 1302. In some cases, the subtractor 106 is implemented in the digital domain to digitally remove the dither that was injected by summer 104 (i.e., downstream of ADC 1304).

A digital backend can then implement the calibration technique described herein. A corrected digital output representing the output with the dither removed (post correction) and the dither are provided to counting circuitry 1306. For example, the counting circuitry 1306 can evaluate counts or histograms of the output for different values of the dither, based on ranges defined by appropriate inspection points, and enable the counts/histograms between different values of the dither to be compared. The counting circuitry 1306 can be simple and cheap to implement since no multipliers are needed to extract the error of the circuit 1302. The partial error circuitry 1307 can determine partial errors at various inspection points based on the counts from counting circuitry 1306 associated with different values of the dither. Specifically, the partial error circuitry 1307 can compare counts associated with different values of the dither to derive partial errors at various inspection points. Moreover, the error circuitry 1308 can combine the partial errors appropriately to expose an error associated with a component of a circuit (e.g., shape/pattern associated with non-linearities or linear gain errors) to form the error estimate. The calibration circuitry 1310 can update a LMS equation to converge on an estimate of a component of a circuit that can reduce the error estimate and/or drive the error estimate to zero. Calibration circuitry 1310 can drive the error estimate to/towards zero, e.g., by modifying the output of the circuit in the analog domain or the digital domain based on the estimate of the component of the circuit and optionally a model for the component of the circuit. When using a corrected output for subsequent error estimation and calibration updates, the calibration circuitry 1310 can enable the calibration (e.g., the LMS equation updates) to converge towards a value for the estimate of the component of the circuit that can best reduce the error. Signal path 1312 illustrates calibration in the analog domain to tune the circuit 1302. Signal path 1314 and correction component 1316 illustrate digital correction on the digital output from ADC 1304. Note that a corrected output is used as input to the counting circuitry 1306 for closed-loop calibration.

In some alternative implementations, the dither is removed in the digital domain (downstream from ADC 1304).

The digital backend (e.g., 1306, 1307, 1308, 1310, and 1314, and possibly the subtractor 106, depending on the implementation) can be implemented with dedicated/specialized digital circuitry and/or an (on-chip) microprocessor programmable to carry out the calibration functionalities herein.

In Example 2, the calibration system of Example 1, can optionally include the dither being a signal having a plurality of values randomly distributed between a plurality of values.

In Example 3, the calibration system of Example 1 or 2 can optionally include the circuit comprising one or more of the following: a buffer, a track and hold circuit, and an amplifier (including a multiplying digital-to-analog converter amplifier).

In Example 4, the calibration system of any one of Examples 1-3 can optionally include the inspection points comprising one or more of the following: a positive value, a positive dither value, a negative value, a negative dither value, and zero.

In Example 5, the calibration system of any one of Examples 1-4 can optionally include the ranges defined by one or more inspection points including one or more of the following: a range of outputs below a first inspection point, and a range of outputs above a second inspection point.

In Example 6, the calibration system of any one of Examples 1-5 can optionally include the inspection points changing randomly to accommodate different input conditions.

In Example 7, the calibration system of any one of Examples 1-5 can optionally include the inspection points changing based on one or more conditions of the input of the circuit.

In Example 8, the calibration system of any one of Examples 1-7 can optionally include the error circuitry comprising subtraction circuitry to subtract counts between different values of the dither to form a partial error estimate at a given inspection point.

In Example 9, the calibration system of any one of Examples 1-9 can optionally include the error circuitry being configured to determine the error estimate by adding partial errors determined at two different inspection points.

In Example 10, the calibration system of any one of Examples 1-9 can optionally include the error circuitry being configured to determine the error estimate by subtracting partial errors determined at two different inspection points.

In Example 11, the calibration system of any one of Examples 1-10 can optionally include the calibration circuitry updating an estimate for a component of the circuit (non-linearity, gain, etc.) based on the error estimate and a least means squared update equation.

In Example 12, the calibration system of any one of Examples 11 can optionally include the calibration circuitry correcting the output of the circuit based on the estimate for the component of the circuit.

Figure 14:
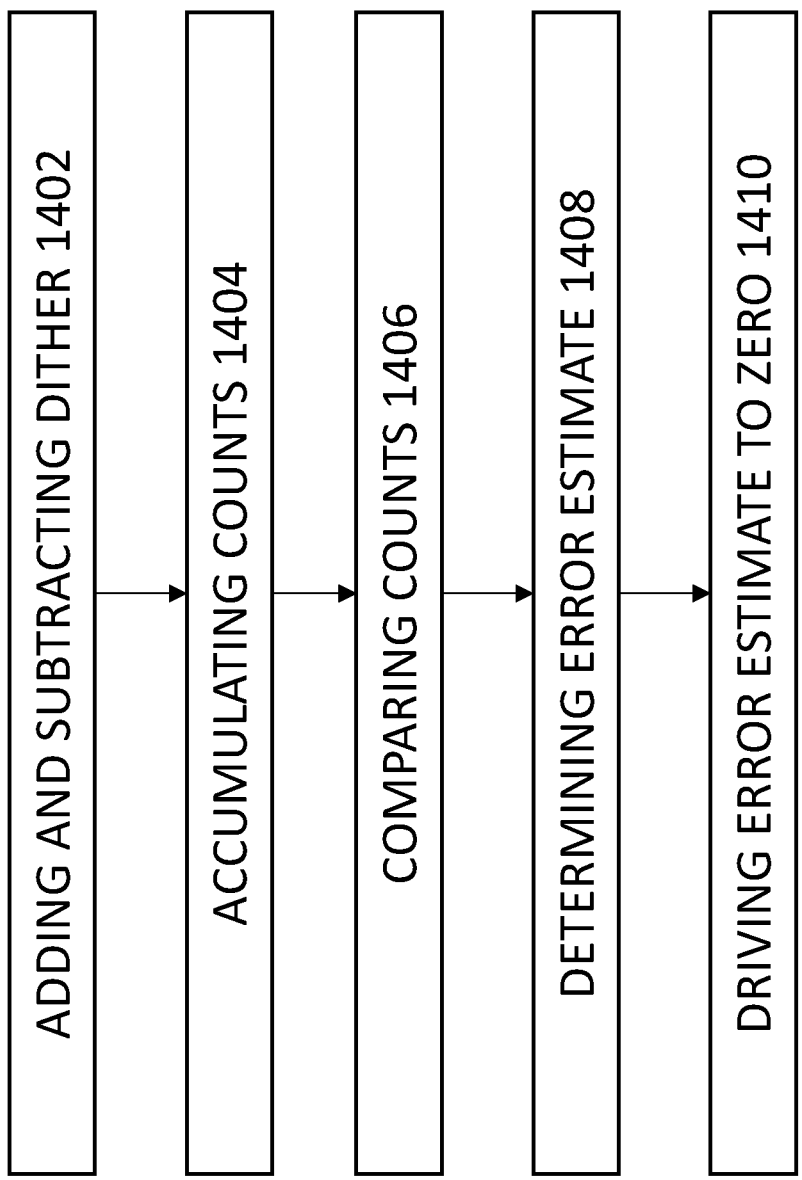
FIG. 14 is a flow diagram illustrating a method for calibrating a circuit, according to some embodiments of the disclosure.

FIG. 14 is a flow diagram illustrating a method for calibrating a circuit, according to some embodiments of the disclosure. Example 101 is a method for (background) calibration of a circuit, comprising: adding a dither at an input of the circuit and subtracting the dither at an output of the circuit (1402); accumulating counts of an output within ranges defined by one or more inspection points of the output (1404); comparing counts associated with different values of the dither (1406); determining an error estimate (1408); and driving the error estimate to zero (1410).

In Example 102, the method of Example 101 can optionally include driving the error to zero comprising updating an estimate of a component of the circuit based on the error estimate (e.g., LMS equation), and correcting an output (a digital output) of the circuit based on the estimate.

In Example 103, the method of Example 102 can optionally include driving the error to zero further comprises updating the estimate of the component of the circuit based on a parameter that enhances even symmetrical errors while attenuating odd symmetrical errors.

In Example 104, the method of Example 102 can optionally include driving the error to zero further comprises updating the estimate of the component of the circuit based on a parameter that enhances odd symmetrical errors while attenuating even symmetrical errors.

In Example 105, the method of any one of Examples 101-104 can optionally include the dither being a signal having a plurality of values randomly distributed between a plurality of values.

In Example 106, the method of any one of Examples 101-105 can optionally include the circuit comprising one or more of the following: a buffer, a track and hold circuit, an amplifier, and a multiplying digital-to-analog converter.

In Example 107, the method of any one of Examples 101-106 can optionally include the inspection points comprising one or more of the following: a positive value, a positive dither value, a negative value, a negative dither value, and zero.

In Example 108, the method of any one of Examples 101-107 can optionally include the ranges defined by one or more inspection points including one or more of the following: a range of outputs below a first inspection point, a range of outputs above a second inspection point.

In Example 109, the method of any one of Examples 101-108 can optionally include changing the inspection points randomly to accommodate different input conditions.

In Example 110, the method of any one of Examples 101-109 can optionally include changing the inspection points based on one or more conditions of the input of the circuit.

In Example 111, the method of any one of Examples 101-110 can optionally include subtracting counts between different values of the dither to form a partial error estimate at a given inspection point.

In Example 112, the method of any one of Examples 101-113 can optionally include determining the error estimate by adding partial errors determined at two different inspection points.

In Example 113, the method of any one of Examples 101-114 can optionally include determining the error estimate by subtracting partial errors determined at two different inspection points.

Example A is an apparatus comprising means for implementing/carrying out any one of the methods described herein.

Example B is an apparatus for estimating errors and calibrating a circuit, comprising: means injecting a dither at an input of a circuit and removing the dither at the output of the circuit; means for evaluating counts of the output of the circuit associated with different values of the dither within ranges defined by one or more inspection points; means for combining the counts associated with different values of the dither to expose an error associated with a component of the circuit; and means for updating an estimate of the component of the circuit based on the error.

In Example C, the apparatus of Example B can optionally include the means for evaluating counts of the output of the circuit comprising counting the output of the circuit falling within the ranges defined by the inspection points.

In Example D, the apparatus of Example B or C can optionally include means for digitally correcting the output of the circuit based on the estimate and a model for the component of the circuit.

Figure 15:
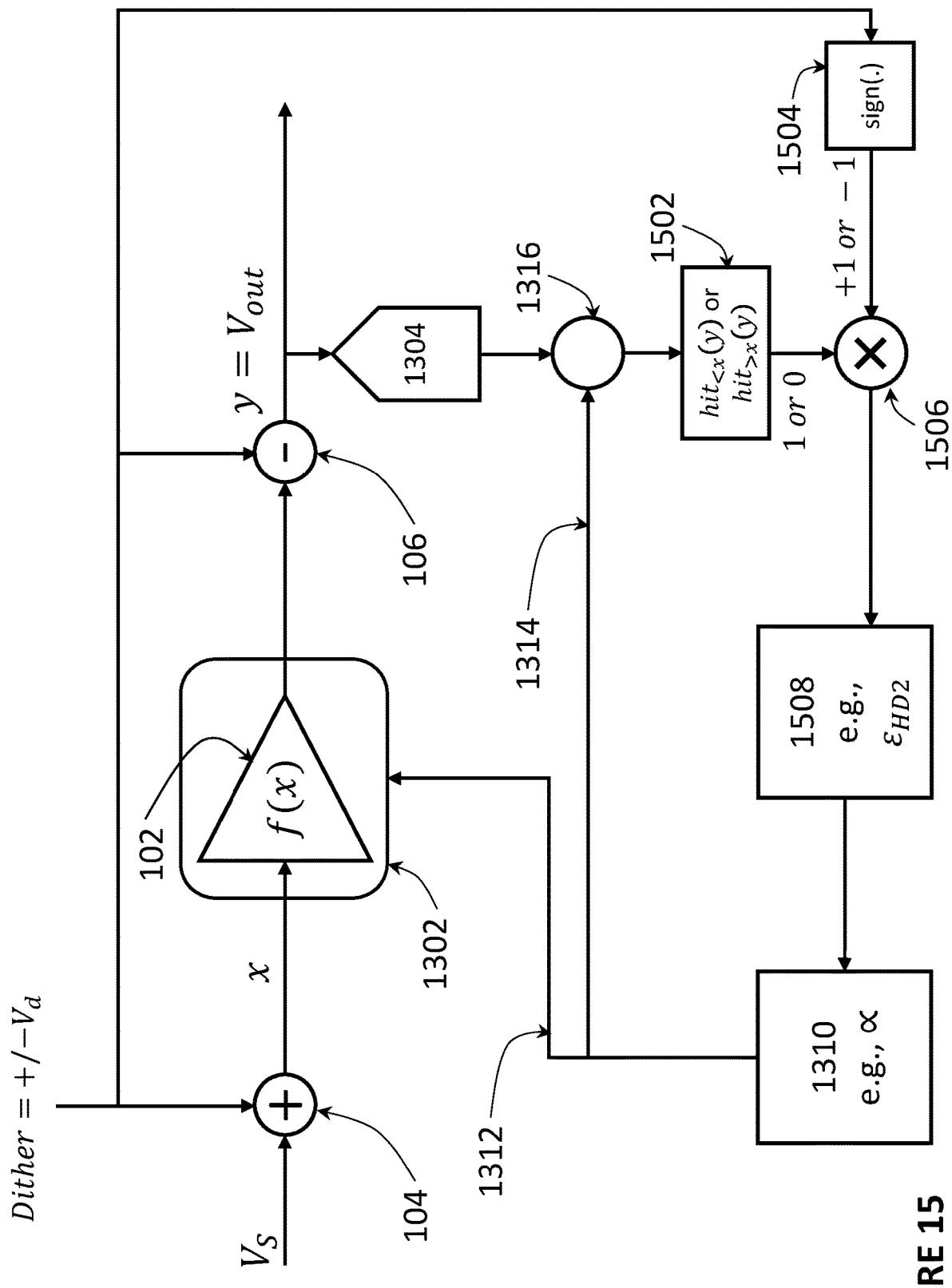
FIG. 15 illustrates another calibration system, according to some embodiments of the disclosure.

As discussed previously, cumulative histograms can be implemented efficiently in hardware by performing counting incrementally, or sample-by sample. FIG. 15 illustrates another calibration system, according to some embodiments of the disclosure. FIG. 15 is similar to FIG. 13, with the exception that the counting and comparing functionalities are replaced by efficient digital operations or digital hardware that can perform counting and comparing incrementally, or sample-by-sample. The incremental or sample-by-sample counting and comparisons is a special case or implementation of the histogram technique. Instead of counting over a block of data and comparing counts/histograms for different dither values, operation 1502 can check whether the corrected output is within a range defined by an inspection point. Operation 1502 can implement hit$_{<x}$(y) or hit$_{>x}$(y), depending on the range defined by the inspection point for a given partial error. Operation 1504 that implements sign(.) can check the sign of the dither. An "AND" operation 1506 can combine the outputs of operation 1502 and 1506 to effectively implement comparison by assigning the sign of the dither value to a hit (as previously illustrated by equations (52) and (53)). The result from the "AND" operation 1506 can form a partial error at a given inspection point. Error circuitry 1508 can then combine partial errors at different inspection points to expose an error associated with a component of a circuit (e.g., shape/pattern associated with non-linearities or linear gain errors) to form the error estimate. The error estimate can be used by calibration circuitry 1310 to update the estimate for a component of the circuit 1302.

Figure 16:
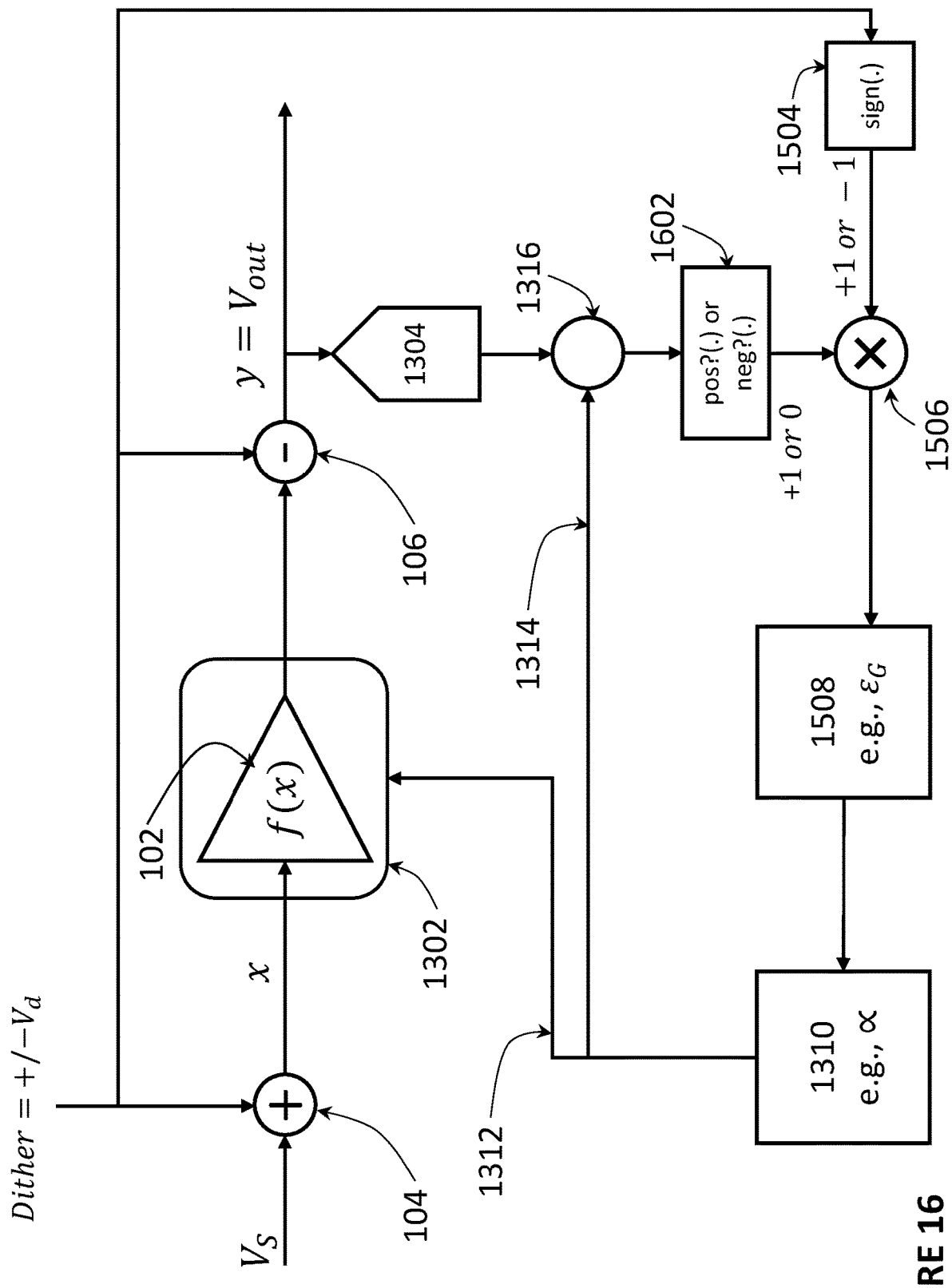
FIG. 16 illustrates yet another calibration system, according to some embodiments of the disclosure.

FIG. 16 illustrates yet another calibration system, according to some embodiments of the disclosure. The calibration system can implement cumulative histograms efficiently in hardware by performing counting incrementally, or sample-by sample. Specifically the calibration system is designed for gain estimation at a zero inspection point. FIG. 16 is similar to FIG. 15, with the exception that operation 1502 is replaced by operation 1602 implementing pos?(.) and neg?(.) operation as a special case to efficiently compute partial errors at a zero inspection point (as previously illustrated in equations (54) and (55)).

Figure 17:
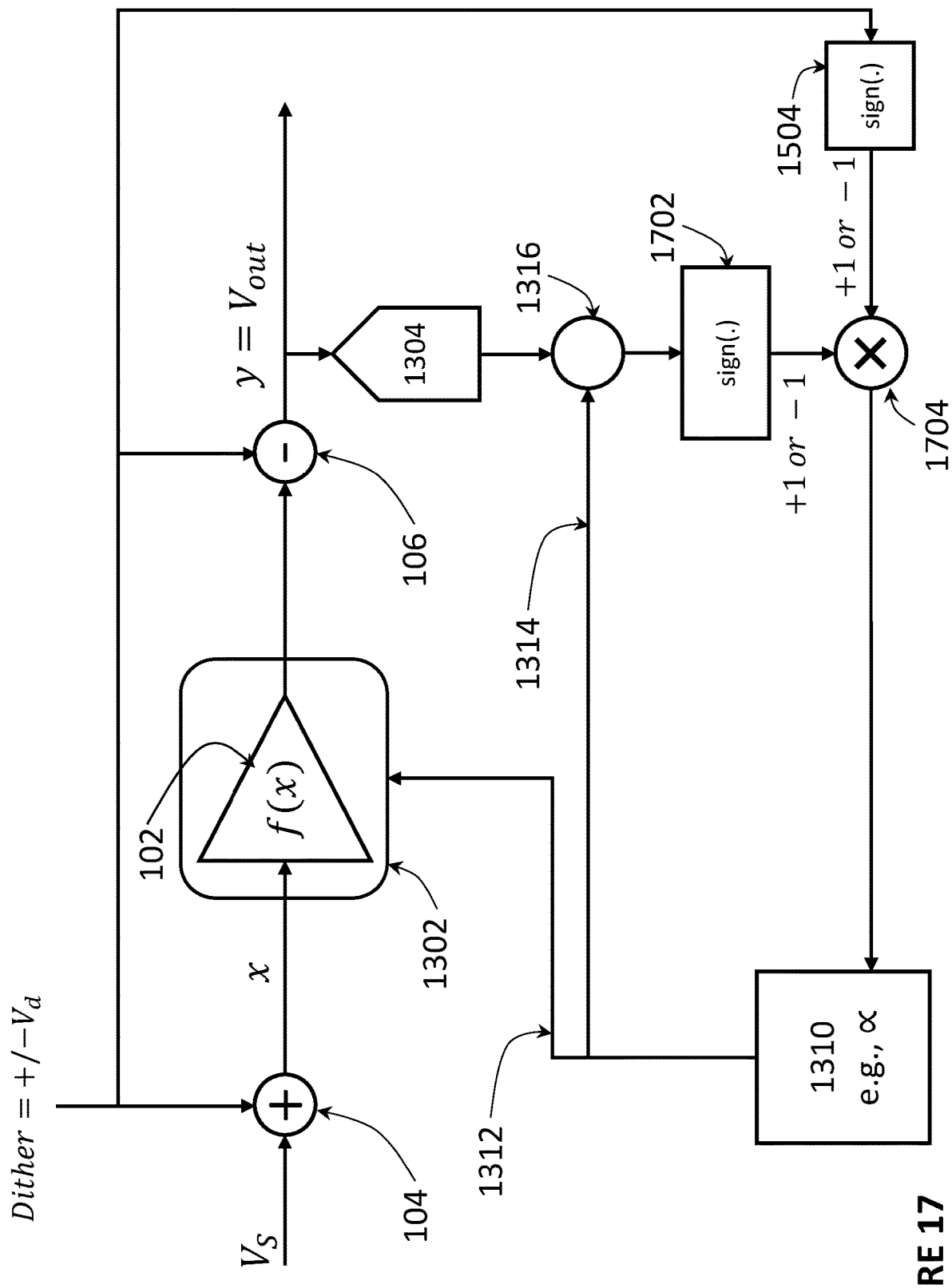
FIG. 17 illustrates yet another calibration system, according to some embodiments of the disclosure.

FIG. 17 illustrates yet another calibration system, according to some embodiments of the disclosure. The calibration system can implement cumulative histograms efficiently in hardware by performing counting incrementally, or sample-by sample. Specifically the calibration system is designed for gain estimation at a zero inspection point. FIG. 17 is similar to FIG. 16, but with a further simplification as a special case to efficiently compute partial errors and obtain the error estimate at a zero inspection point (as previously illustrated by equation (56)). Operation 1702 can check the sign of the output with the dither removed. The result from operation 1702 and the result from operation 1504 can be combined by an "AND" operation 1704 to form the error estimate at the zero inspection point.

Figure 18:
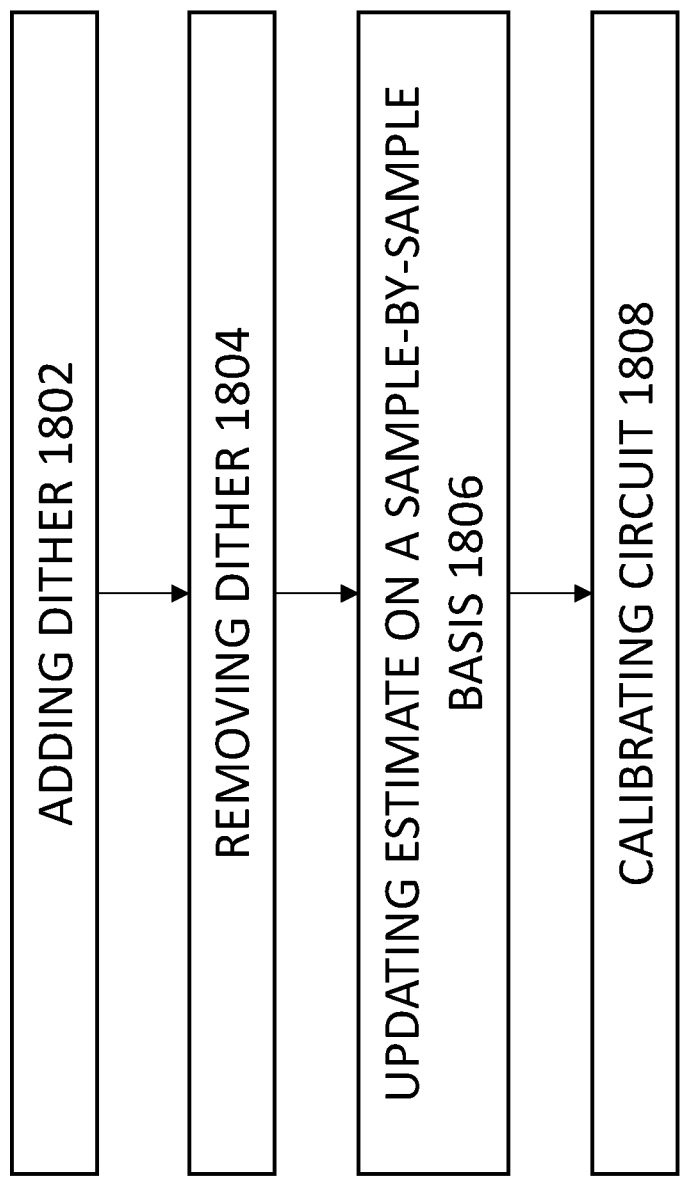
FIG. 18 is a flow diagram illustrating a method for calibrating a circuit, according to some embodiments of the disclosure.

FIG. 18 is a flow diagram illustrating a method for calibrating a circuit, according to some embodiments of the disclosure. Example 21 is a method for efficient error estimation and calibration of a circuit, comprising: adding a dither at an input of the circuit (1802); removing the dither at an output of the circuit (1804); updating an estimate of a component of a circuit on a sample-by-sample basis based on a sign bit of the dither and ranges on the output defined by one or more inspection points (1806); and calibrating the circuit based on the estimate of the component of the circuit (1808).

In Example 22, the method of Example 21 can optionally include updating the estimate of the component of the circuit comprising: setting a first partial error to be the sign bit of the dither if a given sample is within a first range on the output defined by a first inspection point; and setting a second partial error to be the sign bit of the dither if the given sample is within a second range on the output defined by a second inspection point for a second partial error.

In Example 23, the method of Example 22 can optionally include updating the estimate of the component of the circuit further comprising: determining an error estimate based on the first and second partial errors; and updating the estimate of a component of the circuit based on the error estimate.

In Example 24, the method of Example 23 can optionally include updating the estimate of the component of the circuit comprising: setting the first partial error to be zero if the given sample is not with a first range defined by a first inspection point; and setting a second partial error to be zero if the given sample not with within a second range defined by a second inspection point for a second partial error.

In Example 25, the method of any one of Examples 22-24 can optionally include the first inspection point being a positive inspection point, and the second inspection point being a negative inspection point.

In Example 26, the method of any one of Examples 22-24 can optionally include the first inspection point and the second inspection point being the same; and the first range does not overlap with the second range.

In Example 27, the method of any one of Examples 21-26 can optionally include, wherein updating the estimate of the component of the circuit comprises: setting an error estimate based on a sign bit of the dither and a sign bit of the output, and updating the estimate of a component of the circuit based on the error estimate.

Variations and Implementations

Note that the activities discussed above with reference to the FIGURES are applicable to any integrated circuits that involve processing analog signals and converting the analog signals into digital data using one or more ADCs. The features can be particularly beneficial to high speed ADCs, where input frequencies are relatively high in the giga-Hertz range. The ADC can be applicable to medical systems, scientific instrumentation, wireless and wired communications systems (especially systems requiring a high sampling rate), radar, industrial process control, audio and video equipment, instrumentation, and other systems which uses ADCs. The level of performance offered by high speed ADCs can be particularly beneficial to products and systems in demanding markets such as high speed communications, medical imaging, synthetic aperture radar, digital beamforming communication systems, broadband communication systems, high performance imaging, and advanced test/measurement systems (oscilloscopes).

The present disclosure encompasses apparatuses which can perform the various methods described herein. Such apparatuses can include circuitry illustrated by the FIGURES and described herein. Parts of various apparatuses can include electronic circuitry to perform the functions described herein. The circuitry can operate in analog domain, digital domain, or in a mixed-signal domain. In some cases, one or more parts of the apparatus can be provided by a processor specially configured for carrying out the functions described herein (e.g., control-related functions, timing-related functions). In some cases that processor can be an on-chip processor with the ADC. The processor may include one or more application specific components, or may include programmable logic gates which are configured to carry out the functions describe herein. In some instances, the processor may be configured to carrying out the functions described herein by executing one or more instructions stored on one or more non-transitory computer media.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on-chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims (if any) or examples described herein. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims (if any) or examples described herein. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may, or may not necessarily be combined in the same embodiments. It is also important to note that the functions described herein illustrate only some of the possible functions that may be executed by, or within, systems/circuits illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims (if any) or examples described herein. Note that all optional features of the apparatus described above may also be implemented with respect to the method or process described herein and specifics in the examples may be used anywhere in one or more embodiments.

What is claimed is:

1. A method for efficient error estimation and calibration of a circuit, comprising:
adding a dither at an input of the circuit;
removing the dither at an output of the circuit;
determining a sign bit of the dither;
determining whether a given sample of the output is within a first range on the output defined by a first inspection point;
determining whether the given sample of the output is within a second range on the output defined by a second inspection point;
determining a first partial error by logically combining the sign bit of the dither and whether the given sample of the output is within the first range;
determining a second partial error by logically combining the sign bit of the dither and whether the given sample of the output is within the second range;
updating an estimate of a component of a circuit on a sample-by-sample basis based on the first partial error and the second partial error; and
calibrating the circuit based on the estimate of the component of the circuit.

2. The method of claim 1, wherein:
determining the first partial error comprises setting the first partial error to be the sign bit of the dither, if a given sample is within a first range on the output defined by a first inspection point; and
determining the second partial error comprises setting the second partial error to be the sign bit of the dither, if the given sample is within a second range on the output defined by a second inspection point.

3. The method of claim 1, wherein:
determining the first partial error comprises setting the first partial error to be zero, if the given sample is not within a first range defined by a first inspection point; and
determining the second partial error comprises setting the second partial error to be zero, if the given sample is not within a second range defined by a second inspection point.

4. The method of claim 1, wherein updating the estimate of the component of the circuit further comprises:
determining an error estimate based on the first and second partial errors; and
updating the estimate of a component of the circuit based on the error estimate.

5. The method of claim 2, wherein:
the first inspection point is a positive inspection point; and
the second inspection point is a negative inspection point.

6. The method of claim 2, wherein:
the first inspection point and the second inspection point are the same; and
the first range does not overlap with the second range.

7. The method of claim 1, wherein updating the estimate of the component of the circuit comprises:
setting an error estimate based on a sign bit of the dither and a sign bit of the output; and
updating the estimate of a component of the circuit based on the error estimate.

8. A calibration system with efficient error estimation, comprising:
dither circuitry to inject a dither at an input of a circuit and to remove the dither at an output of the circuit;
a first operation to determine whether a corrected output of the circuit is within a first range defined by a first inspection point;
a second operation to obtain a sign of the dither;
a third operation to obtain a first partial error at the first inspection point by logically combining outputs of the first operation and the second operation; and
calibration circuitry to update an estimate of a component of the circuit based on the first partial error at the first inspection point and a second partial error, wherein the second partial error is based on a second inspection point and the sign of the dither.

9. The calibration system of claim 8, wherein the second operation obtains a sign bit of the dither.

10. The calibration system of claim 8, further comprising:
a fourth operation to determine whether the corrected output of the circuit is within a second range defined by the second inspection point;
a fifth operation to obtain the sign of the dither; and
a sixth operation to obtain the second partial error at the first inspection point by logically combining outputs of the fourth operation and the fifth operation.

11. The calibration system of claim 10, wherein the fifth operation obtains a sign bit of the dither.

12. The calibration system of claim 10, further comprising:
error circuitry to combine an output of the third operation and an output of the sixth operation and form an error estimate; and
wherein the calibration circuitry drives the error estimate towards zero.

13. The calibration system of claim 10, wherein:
the first inspection point is a positive inspection point; and
the second inspection point is a negative inspection point.

14. The calibration system of claim 10, wherein:
the first inspection point and the second inspection point are the same; and
the first range does not overlap with the second range.

15. The calibration system of claim 10, wherein:
the first inspection point and the second inspection point are zero; and
the first range does not overlap with the second range.

16. A calibration system with efficient error estimation, comprising:
dither circuitry to inject a dither at an input of a circuit and to remove the dither at an output of the circuit;
error circuitry to:
compute a first partial error by logically combining a sign bit of the dither and whether a given sample of the output is within a first range on the output defined by a first inspection point;
compute a second partial error by logically combining a sign bit of the dither and whether the given sample of the output is within a second range on the output defined by a second inspection point; and
calibration circuitry to update an estimate of a component of the circuit based on the first and second partial errors computed for successive samples of the output of the circuit.

17. The calibration system of claim 16, wherein the error circuitry is to:
   set the first partial error to be a sign bit of the dither, if the given sample is within the first range on the output defined by the first inspection point; and
   set the second partial error to be a sign bit of the dither, if the given sample is within the second range on the output defined by the second inspection point.

18. The calibration system of claim 16, wherein the error circuitry is to:
   set the first partial error to be zero, if the given sample is not within the first range defined by the first inspection point; and
   set the second partial error to be zero, if the given sample is not within the second range defined by the second inspection point.

19. The calibration system of claim 16, wherein the error circuitry comprises:
   a sign operation to determine the sign bit of the dither;
   a hit operation to determine whether the given sample is within the first range or the second range; and
   an AND operation to logically combine outputs of the sign operation and the hit operation.

20. The calibration system of claim 16, wherein the error circuitry comprises:
   a first sign operation to determine a sign bit of the dither;
   a second sign operation to determine a sign bit of the given sample; and
an AND operation to logically combine outputs of the first sign operation and the second sign operation.

\* \* \* \* \*